(12) United States Patent
Jung et al.

(10) Patent No.: US 12,274,139 B2
(45) Date of Patent: *Apr. 8, 2025

(54) DISPLAY DEVICE WITH SIGNAL LINES OF DIFFERENT LAYERS CONNECTED OVER BENDING AREA

(71) Applicant: Samsung Display Co., LTD., Yongin-si (KR)

(72) Inventors: Youngtaeg Jung, Busan (KR); Wonmi Hwang, Seoul (KR); Jintae Jeong, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/332,422

(22) Filed: Jun. 9, 2023

(65) Prior Publication Data

US 2023/0337490 A1  Oct. 19, 2023

Related U.S. Application Data

(63) Continuation of application No. 17/003,508, filed on Aug. 26, 2020, now Pat. No. 11,706,955.

(30) Foreign Application Priority Data

Aug. 30, 2019  (KR) ........................ 10-2019-0106954

(51) Int. Cl.
*H10K 59/131* (2023.01)
*G09G 3/3233* (2016.01)
(Continued)

(52) U.S. Cl.
CPC ......... *H10K 59/131* (2023.02); *G09G 3/3233* (2013.01); *G09G 2300/0809* (2013.01); *H10K 59/124* (2023.02); *H10K 59/126* (2023.02)

(58) Field of Classification Search
CPC .. H10K 59/131; H10K 59/126; H10K 59/124; G09G 3/32233; G09G 2300/0809
See application file for complete search history.

(56) References Cited

U.S. PATENT DOCUMENTS 8,975,761 B2  3/2015  Jung
9,274,389 B2  3/2016  Kang et al.
(Continued)

FOREIGN PATENT DOCUMENTS

EP     3 493 264        6/2019
KR  10-2014-0026189   3/2014
(Continued)

*Primary Examiner* — Lex H Malsawma
(74) *Attorney, Agent, or Firm* — KILE PARK REED & HOUTTEMAN PLLC

(57) ABSTRACT

A display device is provided. The display device includes first, second and third front signal lines disposed on a first portion and electrically connected to light emitting elements, connection lines overlapping a second portion, and first, second and third rear signal lines disposed on a third portion. The first, second and third front signal lines are disposed on different layers. The first front signal line and the first rear signal line are disposed on a same layer. The second front signal line and the second rear signal line are disposed on a same layer. The third front signal line and the third rear signal line are disposed on a same layer. The connection lines electrically and selectively connect the front signal lines and the rear signal lines.

19 Claims, 23 Drawing Sheets

(51) Int. Cl.
  *H10K 59/124* (2023.01)
  *H10K 59/126* (2023.01)

(56) References Cited

U.S. PATENT DOCUMENTS

| | | |
|---|---|---|
| 10,121,977 B2 | 11/2018 | Lee et al. |
| 10,211,277 B2 | 2/2019 | Lee et al. |
| 10,672,802 B2 | 6/2020 | Lee et al. |
| 11,706,955 B2 * | 7/2023 | Jung .................... H10K 59/131 257/72 |
| 2015/0356937 A1 | 12/2015 | Fujikawa |
| 2018/0083072 A1 | 3/2018 | Kwon et al. |
| 2018/0130856 A1 | 5/2018 | Kim et al. |
| 2018/0197484 A1* | 7/2018 | Moon .................. H10K 59/123 |
| 2019/0115407 A1 | 4/2019 | Cho et al. |
| 2019/0123126 A1 | 4/2019 | Song et al. |
| 2019/0164998 A1 | 5/2019 | Cho et al. |
| 2019/0189720 A1 | 6/2019 | Lim et al. |
| 2020/0013848 A1 | 1/2020 | Moon et al. |
| 2020/0328233 A1 | 10/2020 | Cho et al. |
| 2020/0365677 A1 | 11/2020 | Yun et al. |

FOREIGN PATENT DOCUMENTS

| | | |
|---|---|---|
| KR | 10-2014-0053626 | 5/2014 |
| KR | 10-2018-0021341 | 3/2018 |
| KR | 10-2018-0051739 | 5/2018 |
| KR | 10-2018-0056497 | 5/2018 |
| KR | 10-2018-0082688 | 7/2018 |
| KR | 10-1888423 | 8/2018 |
| KR | 10-1903019 | 10/2018 |
| KR | 10-2020-0133118 | 11/2020 |

* cited by examiner

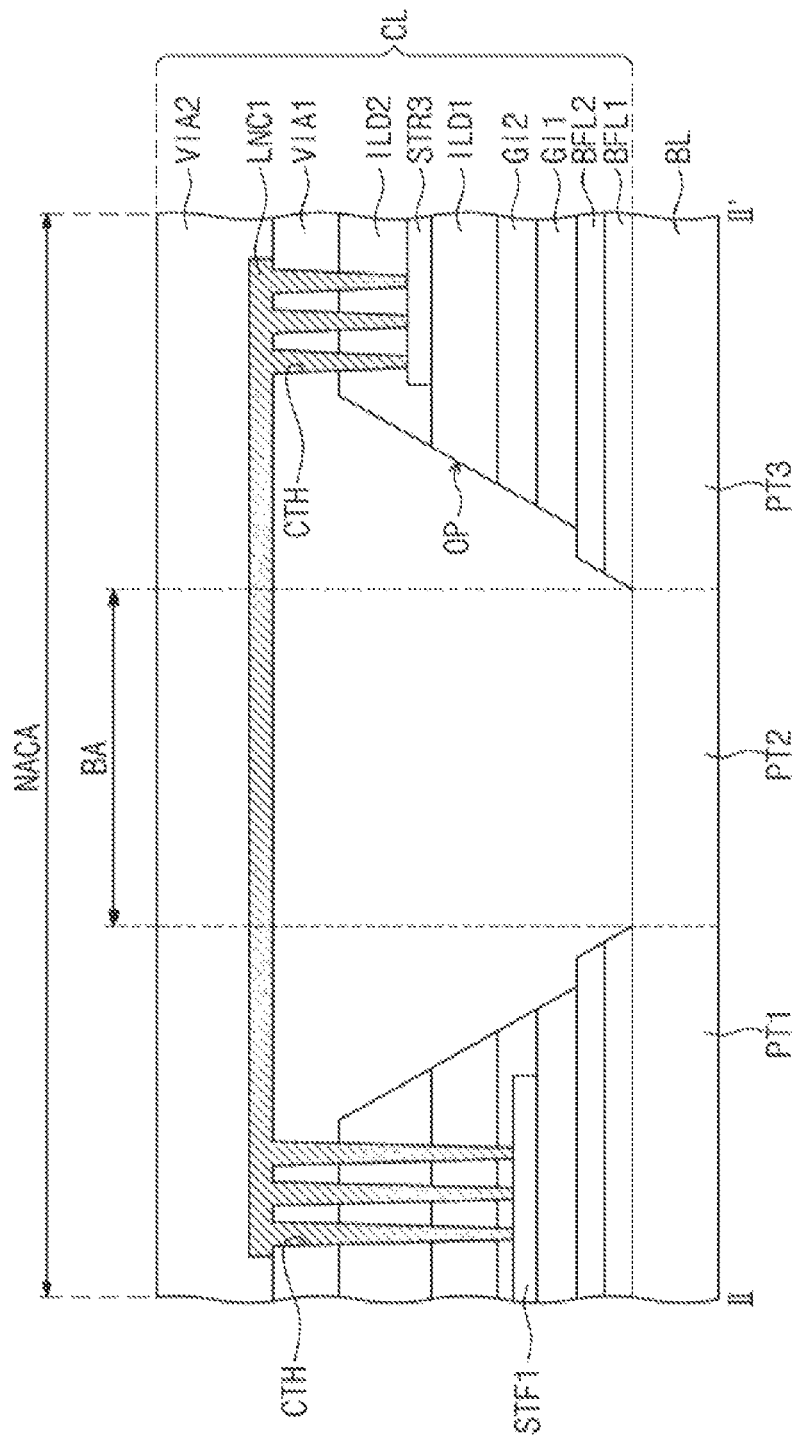

DISPLAY DEVICE WITH SIGNAL LINES OF DIFFERENT LAYERS CONNECTED OVER BENDING AREA

CROSS-REFERENCE TO RELATED APPLICATION(S)

This is a continuation application of U.S. patent application Ser. No. 17/003,508, filed Aug. 26, 2020, now U.S. Pat. No. 11,706,955 the disclosure of which is incorporated herein by reference in its entirety. U.S. patent application Ser. No. 17/003,508 claims priority to and benefits of Korean Patent Application No. 10-2019-0106954 under 35 U.S.C. § 119, filed in the Korean Intellectual Property Office on Aug. 30, 2019, the entire contents of which are incorporated herein by reference.

BACKGROUND

1. Technical Field

The disclosure relates to a display device having a narrow bezel.

2. Description of the Related Art

A display device may display a variety of images on a display screen to provide information to a user. In general, information may be displayed in an assigned screen.

A display device may include a display area displaying information and a non-display area that may surround the display area.

In recent years, the number of signal lines that may be arranged in the non-display area has increased as a resolution of the display device has increased. Accordingly, a width of the non-display area (or a width of a bezel area) may increase, and thus, an aesthetic quality of the display device may decrease.

As display devices increase in size, a difference in length between data signal lines that may transmit data signals to pixels of the display device may be generated. Accordingly, a resistance value of each of the data signal lines may not be uniform, which may result in a decrease in a display quality of the display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device having a narrow bezel and a superior display quality.

Embodiments may provide a display device that may include a base layer including a first portion, a second portion extending from the first portion, and a third portion extending from the second portion. The display device may include light emitting elements including a first light emitting element, a second light emitting element, and a third light emitting element, the light emitting elements disposed on the first portion. The display device may include a first front signal line disposed on the first portion and electrically connected to the first light emitting element, a second front signal line disposed on the first portion and electrically connected to the second light emitting element, wherein the first front signal line and the second front signal line may be disposed on different layers, and a third front signal line electrically connected to the third light emitting element, wherein the first front signal line, the second front signal line, and the third front signal line may be disposed on different layers. The display device may include a first rear signal line disposed on the third portion, wherein the first rear signal line and the first front signal line may be disposed on a same layer, a second rear signal line disposed on the third portion, wherein the second rear signal line and the second front signal line may be disposed on a same layer, and a third rear signal line disposed on the third portion, wherein the third rear signal line and the third front signal line may be disposed on a same layer. The display device may include connection lines that overlap the second portion, wherein at least one of the connection lines electrically connects the first front signal line and the third rear signal line.

The second portion of the base layer may be bent.

The display device may further include a data driving circuit disposed on the third portion of the base layer, and the data driving circuit may be electrically connected to the first rear signal line, the second rear signal line, and the third rear signal line.

Each of the first front signal line, the second front signal line, the third front signal line, the first rear signal line, the second rear signal line, and the third rear signal line may include a first metal material, and each of the connection lines may include a second metal material different from the first metal material.

The first metal material may have a specific resistance greater than a specific resistance of the second metal material.

The first metal material may include molybdenum, and the second metal material may include aluminum.

The connection lines may include a first connection line electrically connecting the first front signal line and the third rear signal line, a second connection line electrically connecting the second front signal line and the second rear signal line, and a third connection line electrically connecting the third front signal line and the first rear signal line.

Each of the first front signal line, the second front signal line, and the third front signal line may be provided in plurality, and front signal lines disposed at an outer side among the first front signal lines, the second front signal lines, and the third front signal lines have a larger width than a width of front signal lines disposed at an inner side among the first front signal lines, the second front signal lines, and the third front signal lines.

The front signal lines disposed at the outer side may have a greater thickness than a thickness of the front signal lines disposed at the inner side.

Each of the first rear signal line, the second rear signal line, and the third rear signal line may be provided in plurality, and rear signal lines disposed at an outer side among the first rear signal lines, the second rear signal lines, and the third rear signal lines have a larger width than a width of rear signal lines disposed at an inner side among the first rear signal lines, the second rear signal lines, and the third rear signal lines.

The rear signal lines disposed at the outer side have a greater thickness than a thickness of the rear signal lines disposed at the inner side.

Connection lines disposed at an outer side among the connection lines may have a larger width than a width of connection lines disposed at an inner side among the connection lines.

The connection lines disposed at the outer side may have a greater thickness than a thickness of the connection lines disposed at the inner side.

The display device may further include transistors disposed on the first portion of the base layer and electrically connected to the light emitting elements, and a power line providing an initialization voltage to the transistors, wherein the power line and the third front signal line may be disposed on a same layer.

The display device may further include a first insulating layer covering the first front signal line and the first rear signal line, the first insulating layer disposed under the second front signal line and the second rear signal line. The display device may further include a second insulating layer covering the second front signal line and the second rear signal line, the second insulating layer disposed under the third front signal line and the third rear signal line. The display device may further include a third insulating layer covering the third front signal line and the third rear signal line, the third insulating layer may be disposed under the connection lines.

The display device may further include contact holes defined through the first insulating layer, the second insulating layer, and the third insulating layer, wherein the first front signal line, the second front signal line, the third front signal line, the first rear signal line, the second rear signal line, and the third rear signal line may be electrically connected to the connection lines through the contact holes.

Embodiments may provide a display device that may include a base layer including a first portion, a second portion extending from the first portion, and a third portion extending from the second portion. The display device may include light emitting elements disposed on the first portion, first front signal lines electrically connected to at least one of the light emitting elements and disposed on the first portion, and second front signal lines electrically connected to at least one of the light emitting elements and disposed on the first portion, wherein the first front signal lines may be disposed on layer different from a layer on which the second front signal lines may be disposed. The display device may include third front signal lines electrically connected to at least one of the light emitting elements and disposed on a layer different from the layer on which the first front signal lines are disposed and the layer on which the second front signal lines may be disposed, second rear signal lines disposed on the third portion and disposed on a same layer as the layer on which the second front signal lines are disposed on, third rear signal lines disposed on the third portion and disposed on a same layer as the layer on which the third front signal lines are disposed on, and connection lines electrically connecting the first front signal lines to the second rear signal lines and electrically connecting the second front signal lines and the third front signal lines to the third rear signal lines.

The second portion of the base layer may be bent.

The display device may further include a data driving circuit disposed on the third portion of the base layer, and the data driving circuit may be electrically connected to the second rear signal lines and the third rear signal lines.

Each of the first front signal lines, the second front signal lines, the third front signal lines, the second rear signal lines, and the third rear signal lines may include a first metal material, and each of the connection lines may include a second metal material different from the first metal material.

The first metal material may have a specific resistance greater than a specific resistance of the second metal material.

The first metal material may include molybdenum, and the second metal material may include aluminum.

Front signal lines disposed at an outer side among the first front signal lines, the second front signal lines, and the third front signal lines may have a larger width than a width of front signal lines disposed at an inner side among the first front signal lines, the second front signal lines, and the third front signal lines; or front signal lines disposed at an outer side among the first front signal lines, the second front signal lines, and the third front signal lines may have a greater thickness than a thickness of front signal lines disposed at an inner side among the first front signal lines, the second front signal lines, and the third front signal lines.

Rear signal lines disposed at an outer side among the second rear signal lines and the third rear signal lines may have a larger width than a width of rear signal lines disposed at an inner side among the second rear signal lines and the third rear signal lines; or rear signal lines disposed at an outer side among the second rear signal lines and the third rear signal lines may have a greater thickness than a thickness of rear signal lines disposed at an inner side among the second rear signal lines and the third rear signal lines.

Connection lines disposed at an outer side among the connection lines may have a larger width than a width of connection lines disposed at an inner side among the connection lines; or connection lines disposed at an outer side among the connection lines may have a greater thickness than a thickness of connection lines disposed at an inner side among the connection lines.

The display device may further include transistors disposed on the first portion of the base layer and electrically connected to the light emitting elements and a power line providing an initialization voltage to the transistors, wherein the power line and the third front signal lines may be disposed on a same layer.

The display device further includes a first insulating layer covering the first front signal lines, the first insulating layer disposed under the second front signal lines and the second rear signal lines, a second insulating layer covering the second front signal lines and the second rear signal lines, the second insulating layer disposed under the third front signal lines and the third rear signal lines, and a third insulating layer covering the third front signal lines and the third rear signal lines, the third insulating layer disposed under the connection lines.

The display device may further include contact holes defined through the first insulating layer, the second insulating layer, and the third insulating layer, wherein the first front signal lines, the second front signal lines, the third front signal lines, the second rear signal lines, and the third rear signal lines may be electrically connected to the connection lines through the contact holes.

According to the above, as the signal lines that transmit the data signals may be stacked in layers, the display device may have a narrow bezel, and an aesthetic quality of the display device may be improved. Since a deviation in color between the pixels may be small, the display device may have a superior display quality.

BRIEF DESCRIPTION OF THE DRAWINGS

The above and other advantages of the disclosure will become readily apparent by reference to the following detailed description when considered in conjunction with the accompanying drawings wherein:

FIG. 7C is a schematic cross-sectional view taken along line II-IF of FIG. 7A;

DETAILED DESCRIPTION OF THE EMBODIMENTS

Figure 1A:
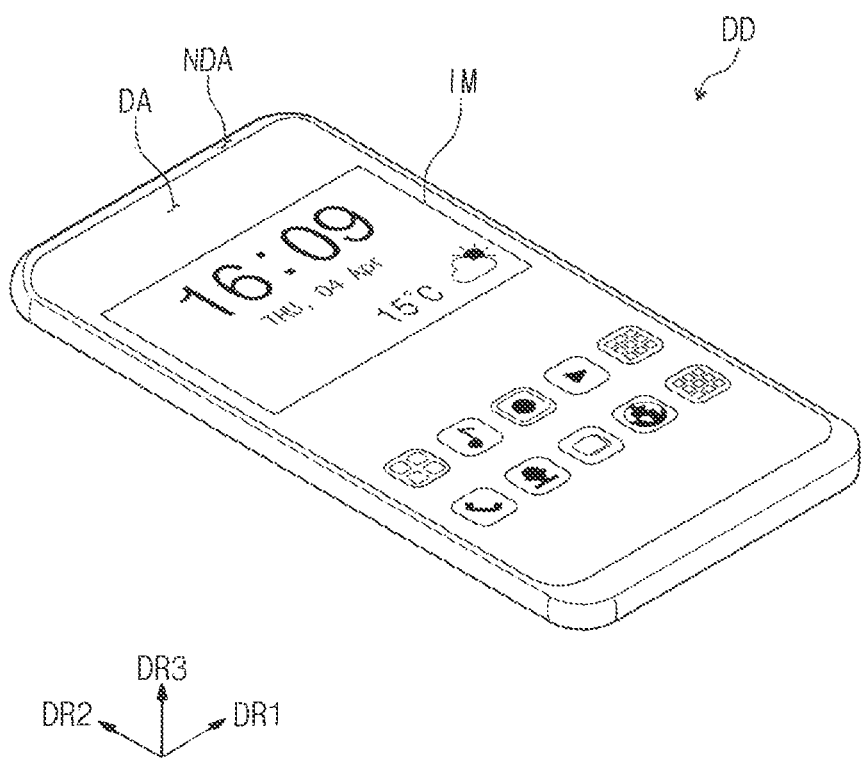
FIG. 1A is a schematic perspective view showing a display device according to an embodiment of the disclosure.

In the following descriptions, the disclosure will be explained in detail with reference to the accompanying drawings. It will be understood that when an element or layer is referred to as being "on", "connected to" or "coupled to" another element or layer, it can be directly on, connected or coupled to the other element or layer or intervening elements or layers may be present.

Like reference characters refer to like elements throughout. In the drawings, the thickness, ratio, and dimension of components may be exaggerated for effective description of the technical content. As used herein, the term "and/or" includes any and all combinations of one or more of the associated listed items. The terms "and" and "or" may be used in the conjunctive or disjunctive sense and may be understood to be equivalent to "and/or."

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "comprises", "comprising", "has", "have", "having", "includes" and/or "including", when used in this specification, specify the presence of stated features, integers, steps, operations, elements, and/or components, but do not preclude the presence or addition of one or more other features, integers, steps, operations, elements, components, and/or groups thereof.

The term overlap may include layer, stack, face or facing, extending over, covering or partly covering or any other suitable term which would be appreciated and understood by those of ordinary skill in the art. The expression 'does not overlap' may include 'apart from' or 'set aside from' or 'offset from' and any other suitable equivalents which would be appreciated and understood by those of ordinary skill in the art.

The phrase "at least one of" is intended to include the meaning of "at least one selected from the group of" for the purpose of its meaning and interpretation. For example, "at least one of A and B" may be understood to mean "A, B, or A and B."

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the disclosure will be explained in detail with reference to the accompanying drawings.

Figure 1B:
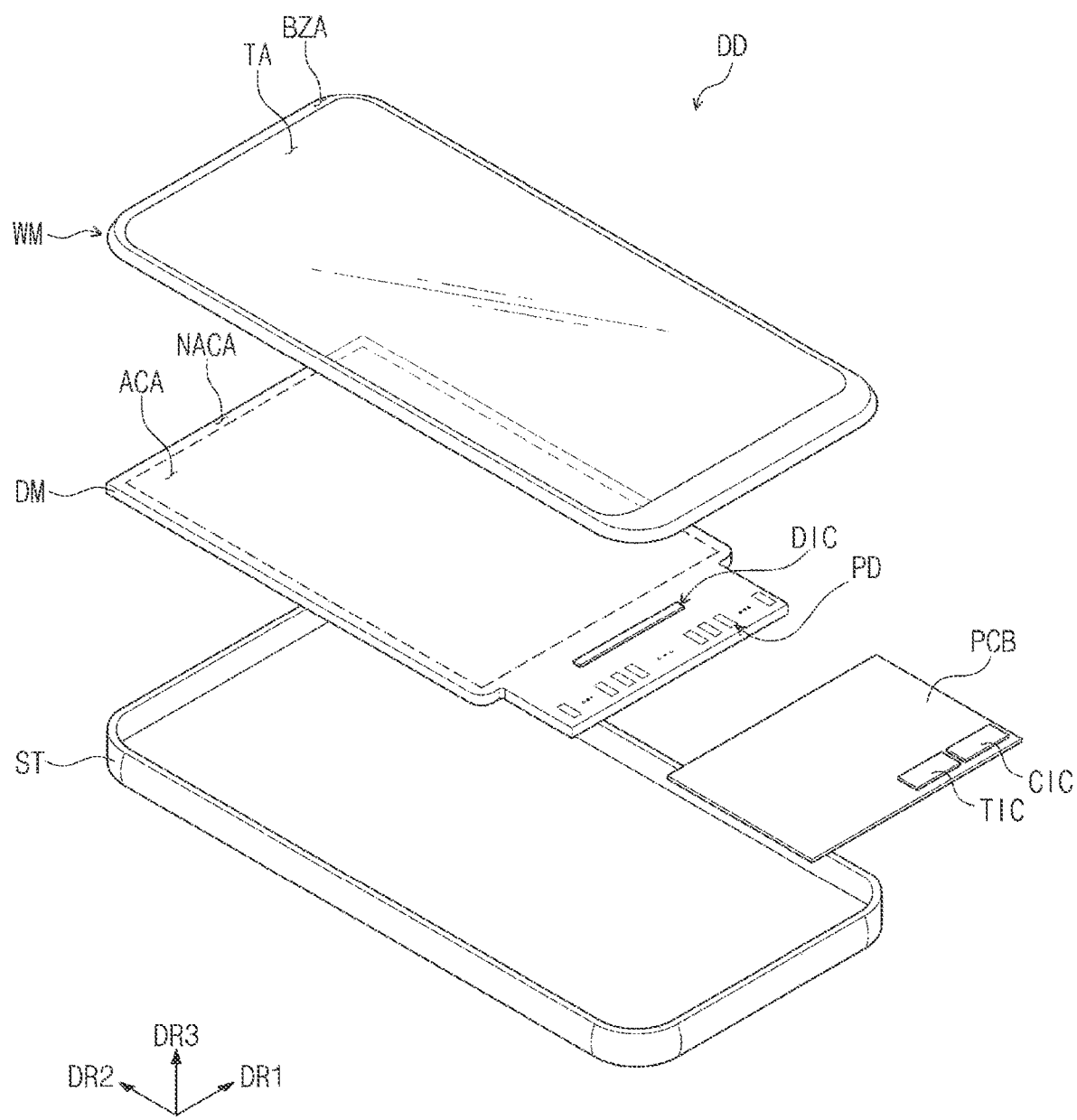
FIG. 1B is an exploded schematic perspective view showing a display device according to an embodiment of the disclosure.

FIG. 1A is a schematic perspective view showing a display device DD according to an embodiment of the disclosure. FIG. 1B is an exploded schematic perspective view showing the display device DD according to an embodiment of the disclosure.

FIG. 1A shows the display device DD embodied as a smart phone as a representative example, however, the display device DD should not be limited to the smartphone. For example, the display device DD may be embodied as a large-sized electronic item, such as a television or a monitor, or a small and medium-sized electronic item, such as a mobile phone, a tablet, a car navigation unit, a game unit, or a smart watch.

The display device DD may include a display area DA and a non-display area NDA. The display area DA and the non-display area NDA may be disposed in the display device DD, however, embodiments should not be limited thereto or thereby. For example, other areas may be further defined in the display device DD. The display area DA may be a pressure sensing area in which an input sensor SP described later may sense an external input. The display area DA may display an image IM and may sense a user's input, for example, a touch event.

The display area DA may be substantially parallel to a surface defined by a first directional axis DR1 and a second directional axis DR2. A third directional axis DR3 may indicate a normal line direction of the display area DA, i.e., a thickness direction of the display device DD. Front (or upper) and rear (or lower) surfaces of each member of the display device DD may be distinguished from each other by the third directional axis DR3. However, directions indicated by the first, second, and third directional axes DR1, DR2, and DR3 are relative to each other and may be changed to other directions. Hereinafter, the first, second, and third directions may be directions respectively indicated by the first, second, and third directional axes DR1, DR2, and DR3 and assigned with the same reference characters.

The shape of the display area DA shown in FIG. 1A is merely exemplary, and the shape of the display area DA may be changed without limitation as necessary. The non-display area NDA may be disposed adjacent to the display area DA, and the image IM may not be displayed in the non-display area NDA. A bezel area of the display device DD may correspond to the non-display area NDA. The non-display area NDA may surround the display area DA, however, the shape of the display area DA and the non-display area NDA should not be limited thereto or thereby and may be changed.

Referring to FIG. 1B, the display device DD may include a window member WM, a display module DM, and a set member ST. The window member WM may include a transmission area TA and a bezel area BZA, which may be disposed therein. However the window member WM should not be limited thereto or thereby, and other areas may be further disposed in the window member WM depending on embodiments.

The transmission area TA may be an area that may transmit light incident thereto. For example, the image IM generated by the display module DM may be perceived by a user after passing through the transmission area TA. The transmission area TA may correspond to the display area DA.

The bezel area BZA may be disposed adjacent to the transmission area TA. For example, the bezel area BZA may surround the transmission area TA. The bezel area BZA may have a predetermined color. The bezel area BZA may overlap the non-display area NDA.

The display module DM may be disposed under the window member WM. The window member WM may protect the display module DM from external impacts.

The display module DM may include an active area ACA and a non-active area NACA, which may be defined therein. The active area ACA may correspond to the display area DA of FIG. 1A, may display the image IM, and may sense a user's input.

The non-active area NACA may correspond to the non-display area NDA, and lines that apply electrical signals to or receive electrical signals from the active area ACA may be arranged in the non-active area NACA.

At least a portion of the set member ST may be disposed under the display module DM. The set member ST may accommodate the window member WM and the display module DM.

Figure 2:
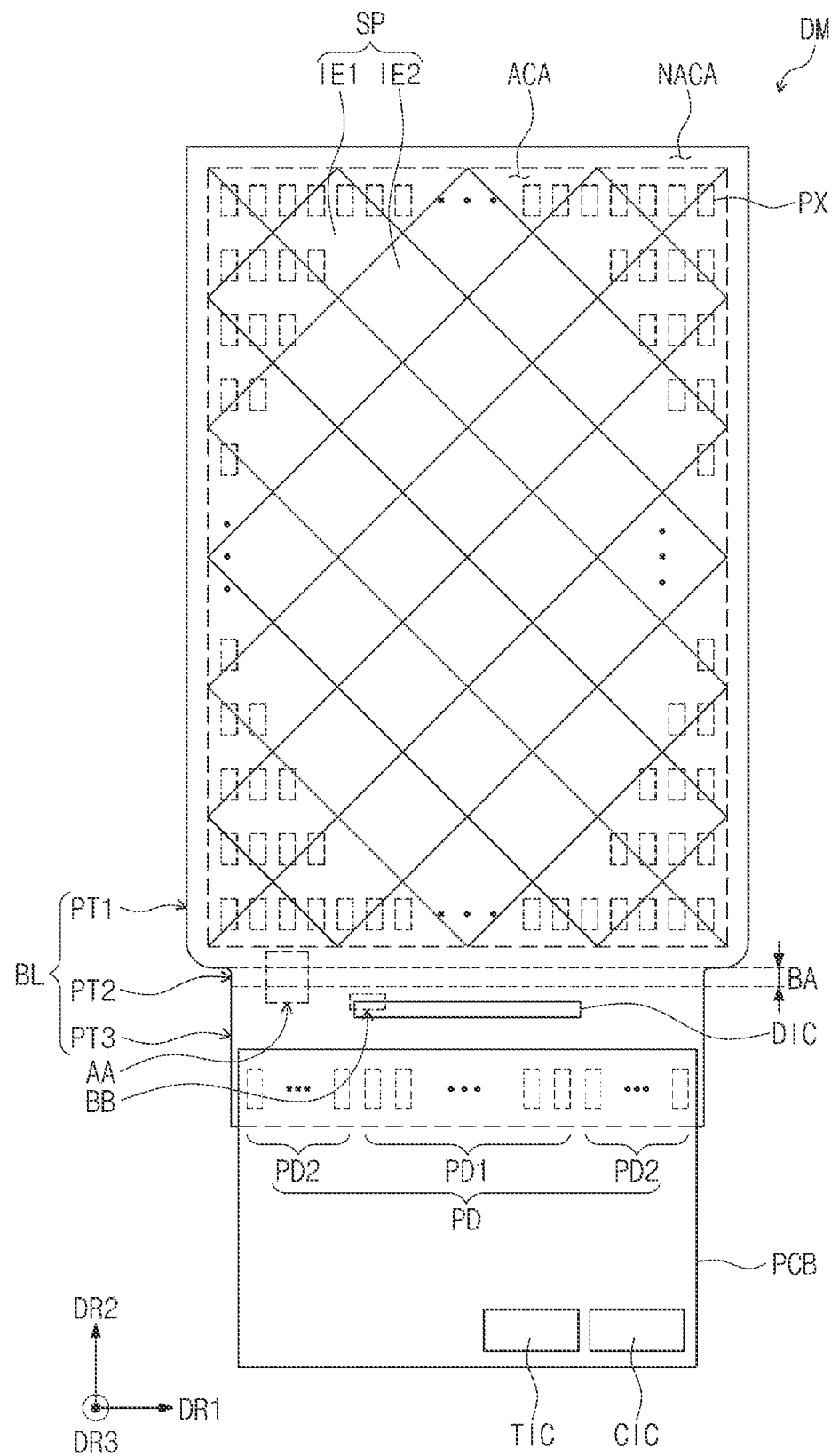
FIG. 2 is a schematic plan view showing a display module according to an embodiment of the disclosure.
Figure 3:
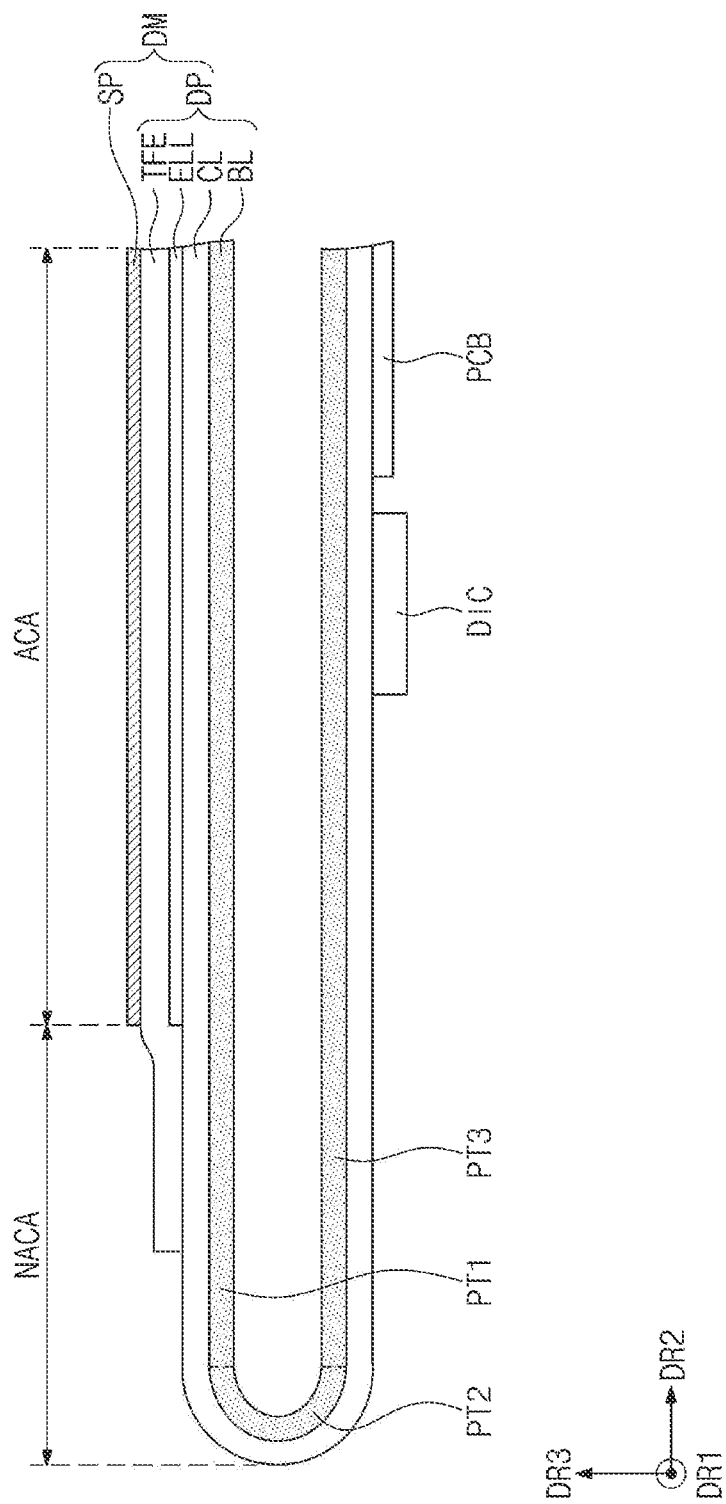
FIG. 3 is a view schematically showing a shape in which the display module of FIG. 2 may be bent with respect to a bending area.

FIG. 2 is a schematic plan view showing the display module DM according to an embodiment of the disclosure. FIG. 3 is a view schematically showing a shape in which the display module DM of FIG. 2 may be bent with respect to bending area BA.

The display module DM may include a display panel DP, an input sensor SP, a data driving circuit DIC, pads PD, a printed circuit board PCB, an input sensing driving circuit TIC, and a control driving circuit CIC.

The display panel DP may include a base layer BL, a circuit layer CL, a light emitting element layer ELL, and an encapsulation layer TFE. The base layer BL may include polyimide PI, however, embodiments should not be limited thereto or thereby. The base layer BL may include a first portion PT1, a second portion PT2 extending from the first portion PT1, and a third portion PT3 extending from the second portion PT2. The first portion PT1, the second portion PT2, and the third portion PT3 may be integrally formed with each other to form the base layer BL.

The second portion PT2 may be an area that may substantially form curvature. The third portion PT3 may be spaced apart from the first portion PT1 in the third direction axis DR3 in a case where the display module DM is bent. The second portion PT2 of the base layer BL may be defined as a bending area BA. A length of the second portion PT2 of the base layer BL, which may be measured in the second direction axis DR2, may be varied as necessary. The circuit layer CL may be disposed on the base layer BL and may include a pixel driving circuit and signal lines. For instance, the circuit layer CL may include transistors T1 to T7 (refer to FIG. 4A), a capacitor CP (refer to FIG. 4A), and lines SLi−1, SLi, SLi+1, DL, VL, and PL (refer to FIG. 4A).

The circuit layer CL may overlap the first portion PT1, the second portion PT2, and the third portion PT3 of the base layer BL. However, configurations of the circuit layer CL, which correspond to the first portion PT1, the second portion PT2, and the third portion PT3, may be different from each other. The circuit layer CL may include the pixel driving circuit disposed corresponding to the active area ACA of the first portion PT1 and the signal line disposed corresponding to the non-active area NACA of the first portion PT1. The circuit layer CL may include the signal lines disposed on different layers from each other to correspond to the second portion PT2 and the third portion PT3.

The light emitting element layer ELL may be disposed on the circuit layer CL and may overlap the first portion PT1 of the base layer BL. The light emitting element layer ELL may include light emitting elements LD (refer to FIG. 4A) electrically connected to the transistors T1 to T7 (refer to FIG. 4A).

The encapsulation layer TFE may be disposed on the light emitting element layer ELL and may encapsulate the light emitting element layer ELL. A portion of the encapsulation layer TFE may overlap the non-active area NACA. Although not shown separately, other insulating layers may be further disposed between the light emitting element layer ELL and the encapsulation layer TFE or between the encapsulation layer TFE and the input sensor SP to improve optical properties.

The input sensor SP may be disposed on the encapsulation layer TFE and may overlap the first portion PT1 of the base layer BL. In FIG. 3, the input sensor SP may be directly disposed on the encapsulation layer TFE, however, according to another embodiment, the input sensor SP may be attached onto the encapsulation layer TFE by an adhesive member.

The input sensor SP may include a first sensor IE1 and a second sensor IE2. Each of the first sensor IE1 and the second sensor IE2 may include an electrode containing a metal material. Each of the first sensor IE1 and the second sensor IE2 may have a mesh shape.

First sensors IE1 may form a capacitance with second sensors IE2. In a case where a user touches the active area ACA, the capacitance between the first sensor IE1 and the second sensor IE2 may be changed. The input sensing driving circuit TIC may sense the change in the capacitance of the input sensor SP and may determine which point of the active area ACA may be touched by the user.

A configuration of the input sensor SP should not be particularly limited. The display module DM may include a mutual-capacitance driving type input sensor including two kinds of sensors or a self-capacitance driving type input sensor including one sensor. An input sensor rather than a capacitive type sensor may be applied to the display module DM.

The data driving circuit DIC may overlap the third portion PT3 of the base layer BL. For example, the data driving circuit DIC may be disposed (e.g. mounted) on the third portion PT3 of the base layer BL.

The data driving circuit DIC may be electrically connected to pixels PX of the active area ACA to provide data signals to the pixels PX.

The pads PD may include first pads PD1 and second pads PD2.

The first pads PD1 may transmit electrical signals to the pixels PX through the data driving circuit DIC. The first pads PD1 may be electrically connected to at least one of the transistors T1 to T7 (refer to FIG. 4A) of the pixels PX.

The second pads PD2 may be electrically connected to the input sensor SP. Each of the second pads PD2 may be electrically connected to one of the first sensor IE1 and the second sensor IE2.

The printed circuit board PCB may be electrically connected to the pads PD. The input sensing driving circuit TIC and the control driving circuit CIC may be mounted on the printed circuit board PCB.

The input sensing driving circuit TIC may sense the change in the capacitance of the input sensor SP using the second pads PD2. Accordingly, the input sensing driving circuit TIC may sense the user's touch applied to the active area ACA and a pressure applied thereto from the outside.

The control driving circuit CIC may be a circuit to control at least one of the data driving circuit DIC and the input sensing driving circuit TIC.

A portion of the display module DM, which corresponds to the second portion PT2 (or the bending area BA) of the base layer BL, may be bent.

Although not shown separately, an anti-reflective member may be disposed between the display module DM and the window member WM. The anti-reflective member may be a polarizing film or a polarizing plate.

Although not shown separately, the display module DM may further include a synthetic resin layer or a synthetic resin film disposed to correspond to the bending area BA of the display module DM. The synthetic resin layer or the synthetic resin film may reduce a stress of the signal lines disposed in the bending area BA.

Figure 4A:
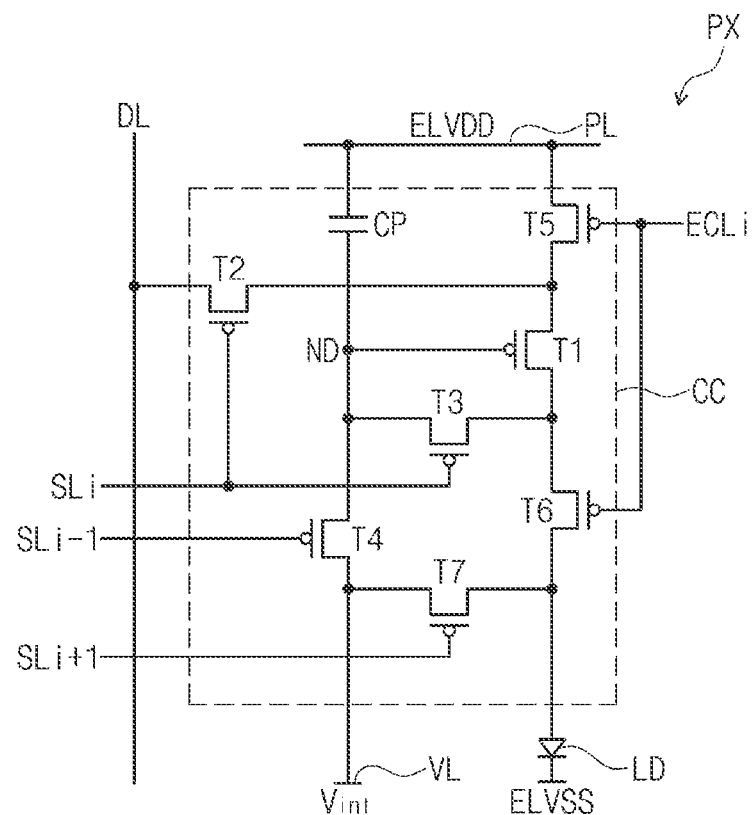
FIG. 4A is a schematic circuit diagram showing a pixel of FIG. 2.
Figure 4B:
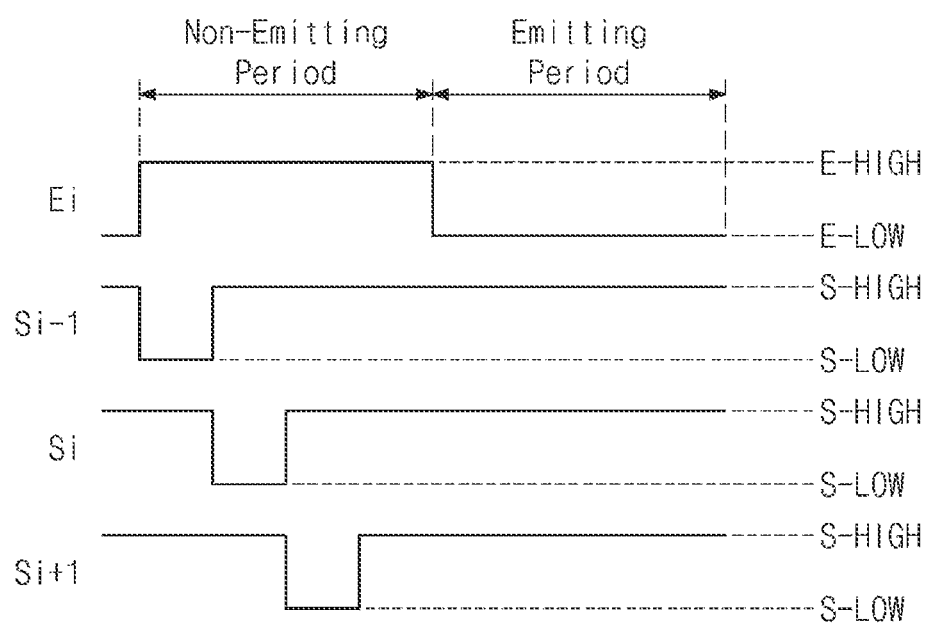
FIG. 4B is a schematic timing diagram showing driving signals applied to the pixel of FIG. 4A.

FIG. 4A is a schematic circuit diagram showing a pixel PX according to an embodiment of the disclosure. FIG. 4B is a schematic timing diagram showing driving signals applied to the pixel PX of FIG. 4A. FIG. 4A shows the pixel PX electrically connected to an i-th scan line SLi, an (i+1)th scan line SLi+1, and an i-th light emitting control line ECLi as a representative example.

The pixel PX may include the light emitting element LD and a pixel circuit CC. The pixel circuit CC may include the transistors T1 to T7 and the capacitor CP. The pixel circuit CC may control an amount of current flowing through the light emitting element LD in response to the data signal.

The light emitting element LD may emit light at predetermined luminance corresponding to the amount of current supplied from the pixel circuit CC. To this end, an electric potential of a first power supply voltage ELVDD may be set higher than an electric potential of a second power supply voltage ELVSS. The first power supply voltage ELVDD may be applied to a first power line PL.

Each of the transistors T1 to T7 may include a source, a drain, and a gate. The source, the drain, and the gate may be implemented in the form of electrode or may be implemented in a partial area of a semiconductor pattern. The source, the drain, and the gate of the electrode form may include a metal pattern. The source, the drain, and the gate of the semiconductor form may include a semiconductor area having a conductivity since they may have a high doping concentration. An area that may not be doped or has a relatively low doping concentration may correspond to an active region of the transistor.

In the disclosure, for the convenience of explanation, one of the source and the drain will be referred to as a "first electrode", and the other of the source and the drain will be referred to as a "second electrode". The gate will be referred to as a "control electrode".

A first electrode of a first transistor T1 may be electrically connected to the first power line PL via a fifth transistor T5, and a second electrode of the first transistor T1 may be electrically connected to an anode electrode of the light emitting element LD via a sixth transistor T6. The first transistor T1 may be referred to as a "driving transistor" in the disclosure. The first transistor T1 may control the amount of the current flowing through the light emitting element LD in response to a voltage applied to the control electrode thereof.

A second transistor T2 may be electrically connected between the data line DL and the first electrode of the first transistor T1. A control electrode of the second transistor T2 may be electrically connected to the i-th scan line SLi. The second transistor T2 may be turned on in a case where an i-th scan signal Si may be applied to the i-th scan line SLi to electrically connect the data line DL and the first electrode of the first transistor T1.

A third transistor T3 may be electrically connected between the second electrode and the control electrode of the first transistor T1. A control electrode of the third transistor T3 may be electrically connected to the i-th scan line SLi. The third transistor T3 may be turned on in a case where the i-th scan signal Si may be applied to the i-th scan line SLi to electrically connect second electrode and the control electrode of the first transistor T1. Therefore, in a case where the third transistor T3 may be turned on, the first transistor T1 may be electrically connected in a diode configuration.

A fourth transistor T4 may be electrically connected between a control node ND and a second power line VL. A control electrode of the fourth transistor T4 may be electrically connected to an (i−1)th scan line SLi−1. The fourth transistor T4 may be turned on in a case where an (i−1)th scan signal Si−1 may be applied to the (i−1)th scan line SLi−1 to apply an initialization voltage Vint to the control node ND.

A fifth transistor T5 may be electrically connected between the first power line PL and the first electrode of the first transistor T1. A control electrode of the fifth transistor T5 may be electrically connected to the i-th light emitting control line ECLi.

A sixth transistor T6 may be electrically connected between the second electrode of the first transistor T1 and the anode electrode of the light emitting element LD. A control electrode of the sixth transistor T6 may be electrically connected to the i-th light emitting control line ECLi.

A seventh transistor T7 may be electrically connected between the second power line VL and the anode electrode of the light emitting element LD. A control electrode of the seventh transistor T7 may be electrically connected to the (i+1)th scan line SLi+1. The seventh transistor T7 may be turned on in a case where an (i+1)th scan signal Si+1 may be applied to the (i+1)th scan line SLi+1 to apply the initialization voltage Vint to the anode electrode of the light emitting element LD.

The capacitor CP may be electrically connected between the first power line PL and the control node ND. The capacitor CP may be charged with a voltage corresponding to the data signal. In a case where the fifth transistor T5 and the sixth transistor T6 may be turned on, an amount of current flowing through the first transistor T1 may be determined depending on the voltage charged in the capacitor CP.

Referring to FIG. 4B, a light emitting control signal Ei may have a high level E-HIGH or a low level E-LOW. Each of the scan signals Si−1, Si, and Si+1 may have a high level S-HIGH or a low level S-LOW.

In a case where the light emitting control signal Ei has the high level E-HIGH, the fifth transistor T5 and the sixth transistor T6 may be turned off. In a case where the fifth transistor T5 may be turned off, the first power line PL and the first electrode of the first transistor T1 may be electrically disconnected from each other. In a case where the sixth transistor T6 may be turned off, the second electrode of the first transistor T1 and the anode electrode of the light emitting element LD may be electrically disconnected from each other. Thus, the light emitting element LD may not emit the light during a period in which the light emitting control signal Ei having the high level E-HIGH may be applied to the i-th light emitting control line ECLi.

In a case where the (i−1)th scan signal Si−1 applied to the (i−1)th scan line SLi−1 has the low level S-LOW, the fourth transistor T4 may be turned on. In a case where the fourth transistor T4 may be turned, the initialization voltage Vint may be applied to the control node ND.

In a case where the i-th scan signal Si applied to the i-th scan line SLi has the low level S-LOW, the second transistor T2, and the third transistor T3 may be turned on. In a case where the (i+1)th scan signal Si+1 applied to the i-th scan line SLi has the low level S-LOW, the seventh transistor T7 may be turned on.

In a case where the second transistor T2 may be turned on, the data signal may be applied to the first electrode of the first transistor T1. Since the control node ND may be initialized to the initialization voltage Vint, the first transistor T1 may be turned on. In a case where the first transistor T1 may be turned on, the voltage corresponding to the data signal may be applied to the control node ND. The capacitor CP may be charged with the voltage corresponding to the data signal.

In a case where the seventh transistor T7 may be turned on, the initialization voltage Vint may be applied to the anode electrode of the light emitting element LD, and thus, a parasitic capacitance of the light emitting element LD may be discharged.

In a case where the light emitting control signal Ei applied to the i-th light emitting control line ECLi has the low level E-LOW, the fifth transistor T5 and the sixth transistor T6 may be turned on. In a case where the fifth transistor T5 may be turned on, the first power supply voltage ELVDD may be provided to the first electrode of the first transistor T1. In a case where the sixth transistor T6 may be turned on, the second electrode of the first transistor T1 and the anode electrode of the light emitting element LD may be electrically connected to each other. The light emitting element LD may generate light having predetermined luminance corresponding to the amount of current provided thereto.

FIG. 4A shows the pixel PX implemented by PMOS transistors as a representative example, however, embodiments should not be limited thereto or thereby. According to another embodiment of the disclosure, the pixel PX may be implemented by NMOS transistors. According to another embodiment of the disclosure, the pixel PX may be implemented by a combination of NMOS transistors and PMOS transistors.

In the disclosure, the structure of the pixel PX should not be limited to the structure shown in FIG. 4A. According to another embodiment of the disclosure, the pixel PX may be implemented in various ways to allow the light emitting element LD to emit the light. In an embodiment of the disclosure, the light emitting element LD may be an organic light emitting element, a micro LED, or a light emitting element using a quantum dot.

Figure 5A:
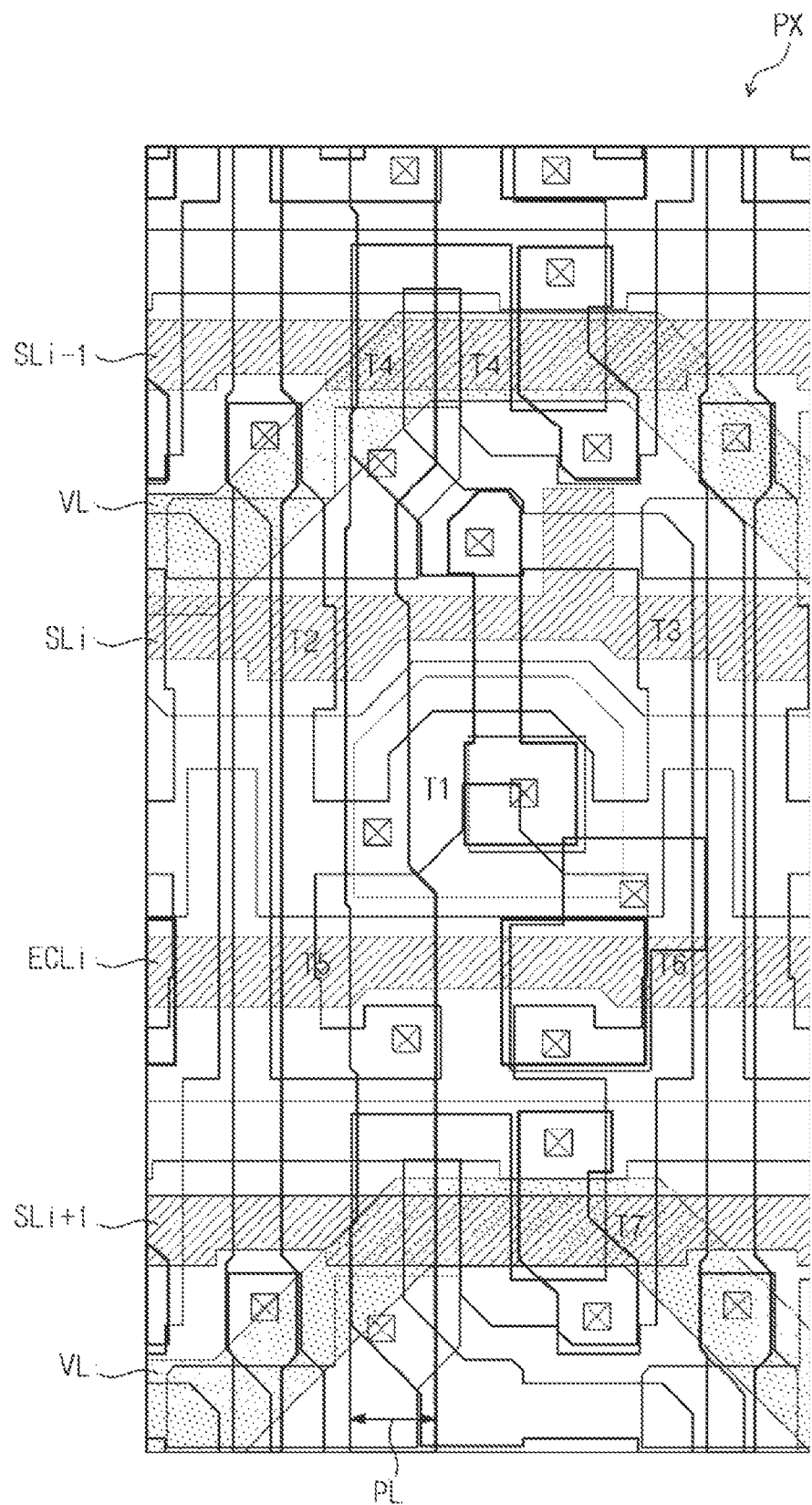
FIG. 5A is a schematic diagram showing a layout of the pixel corresponding to the schematic circuit diagram of FIG. 4A.
Figure 5B:
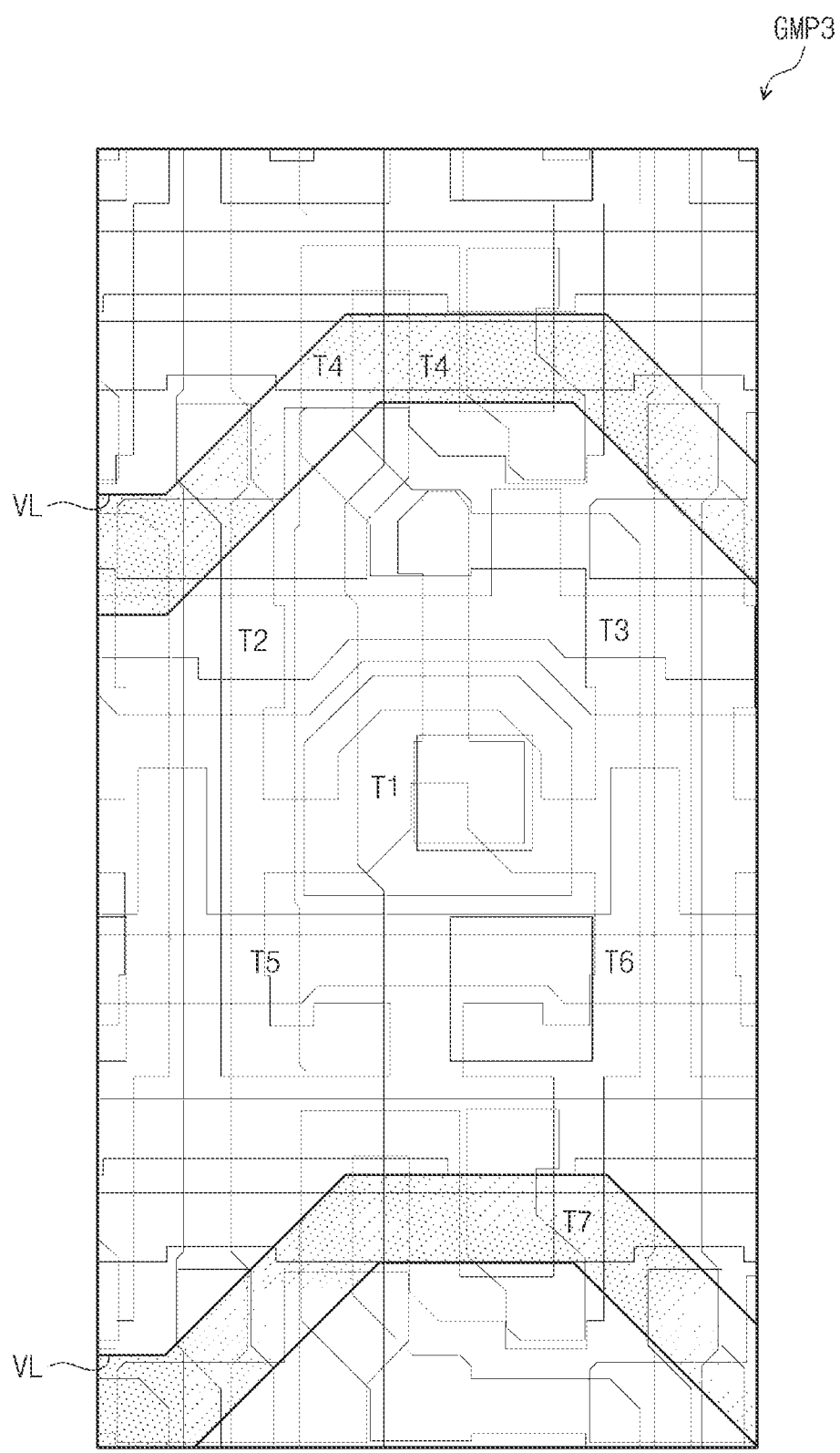
FIG. 5B is a schematic plan view showing a conductive pattern included in a third conductive layer according to an embodiment of the disclosure.
Figure 6A:
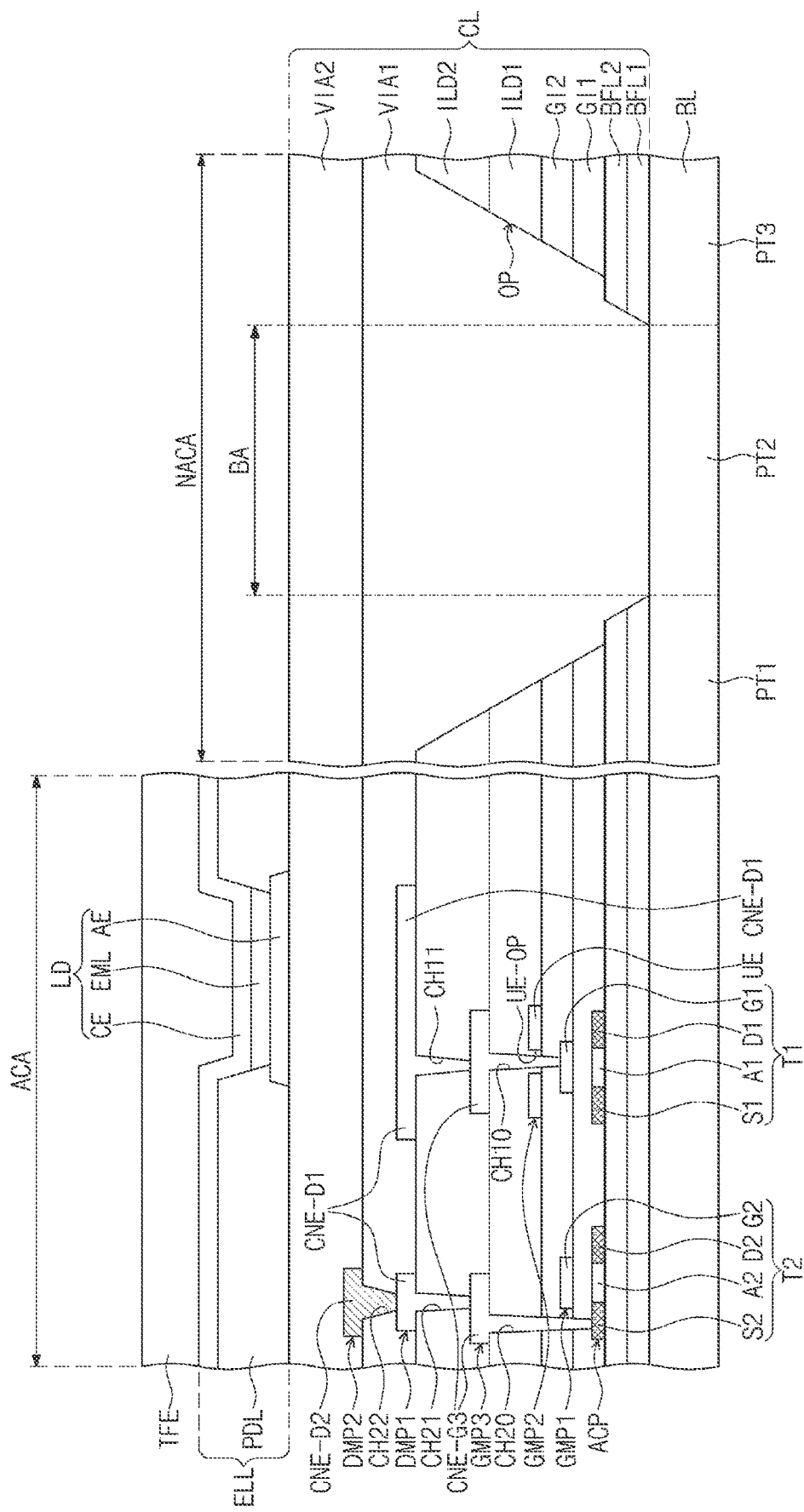
FIGS. 6A and 6B are schematic cross-sectional views showing display panels according to an embodiment of the disclosure.
Figure 6B:
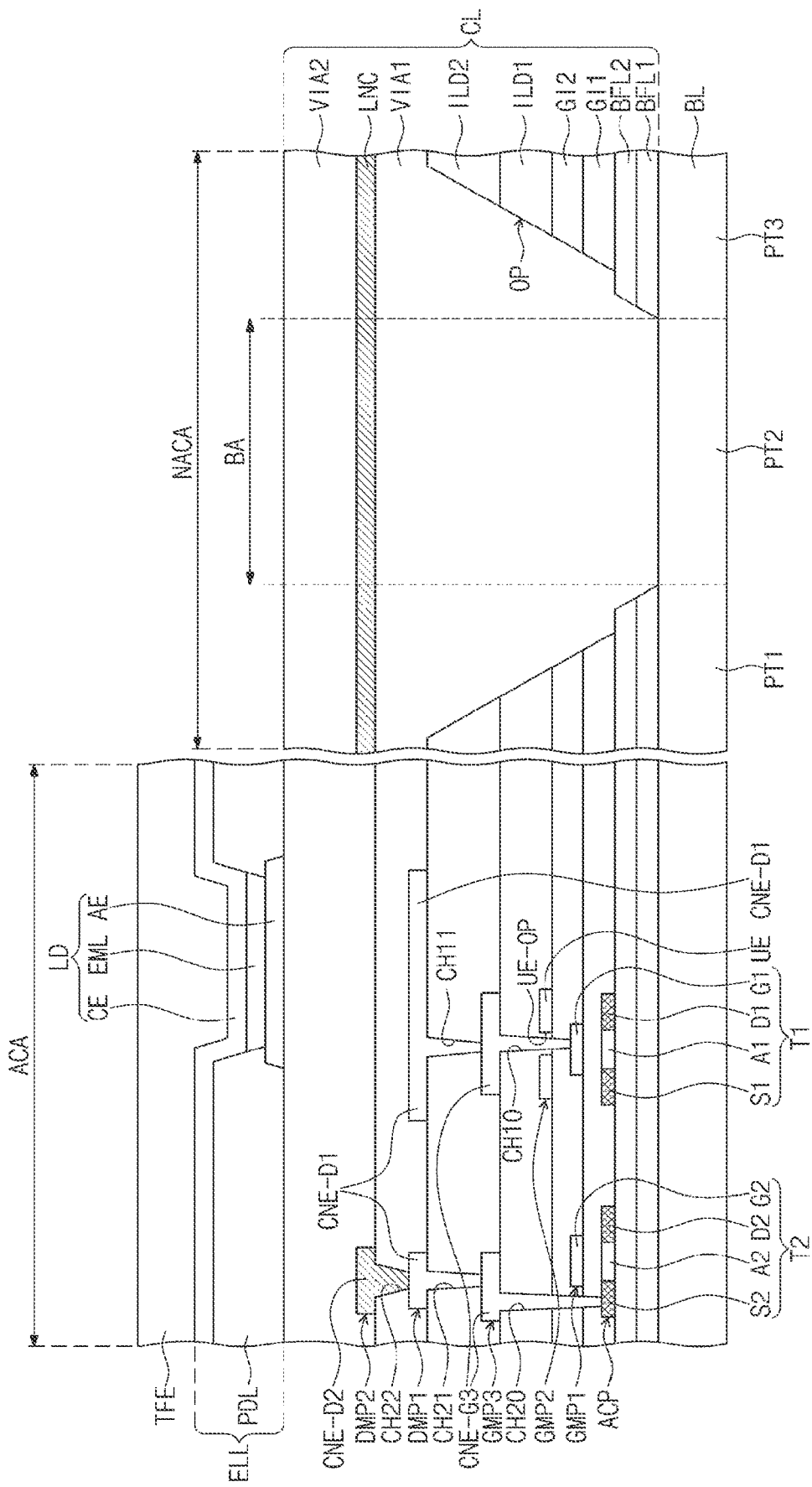

FIG. 5A is a schematic diagram showing a layout of the pixel PX corresponding to the schematic circuit diagram of FIG. 4A. FIG. 5B is a schematic plan view showing a conductive pattern included in a third conductive layer GMP3. FIGS. 6A and 6B are schematic cross-sectional views showing display panels DP according to an embodiment of the disclosure. Each of FIGS. 6A and 6B partially includes the active area ACA and the non-active area NACA, FIG. 6B shows the cross-section that overlaps the signal line of the bending area BA, and FIG. 6A shows the cross-section that does not overlap the signal line of the bending area BA.

Referring to FIG. 5A, the first to seventh transistors T1 to T7 of the pixel PX are shown. The scan lines SLi−1, SLi, and SLi+1, the i-th light emitting control line ECLi, the first power line PL, and the second power line VL are shown. FIG. 5A shows a stack structure from the base layer BL to a fifth conductive layer DMP2 of FIG. 6A.

Referring to FIG. 6A, the circuit layer CL may include a first buffer layer BFL1, a second buffer layer BFL2, a first insulating layer GI1, a second insulating layer GI2, a third insulating layer ILD1, a fourth insulating layer ILD2, a fifth insulating layer VIA1, a sixth insulating layer VIA2, a semiconductor layer ACP including patterns, a first conductive layer GMP1 including patterns, a second conductive layer GMP2 including patterns, a third conductive layer GMP3 including patterns, a fourth conductive layer DMP1 including patterns, and a fifth conductive layer DMP2 including patterns.

The first to seventh transistors T1 to T7, the scan lines SLi−1, SLi, and SLi+1, the i-th light emitting control line ECLi, the first power line PL, and the second power line VL of the pixel PX may be formed by a conductive pattern of the first, second, third, fourth, and fifth conductive layers GMP1, GMP2, GMP3, DMP1, and DMP2 and a semiconductor pattern of the semiconductor layer ACP that form the circuit layer CL. In FIG. 5A, the pixel PX including two fourth transistors T4 electrically connected to each other in series is shown as a representative example.

FIG. 5B shows the second power line VL included in the third conductive layer GMP3. The third conductive layer GMP3 may further include another conductive pattern. The second power line VL corresponds to one conductive pattern included in the third conductive layer GMP3, and the conductive pattern may be named the second power line VL since the conductive pattern having a line-shape receives the initialization voltage Vint.

A line pattern that may not receive the initialization voltage Vint may be disposed in the same form as the second power line VL in an embodiment of the disclosure. The line pattern may overlap some transistors, for example, the fourth and seventh transistors T4 and T7, to block the external light from entering the transistors. Accordingly, voltage-current characteristics of the transistor may be prevented from being changed by the external light.

The first insulating layer GI1 may be a first gate insulating layer, the second insulating layer GI2 may be a second gate insulating layer, the third insulating layer ILD1 may be a first interlayer insulating layer, the fourth insulating layer ILD2 may be a second interlayer insulating layer, the fifth insulating layer VIA1 may be a first via layer, the sixth insulating layer VIA2 may be a second via layer, the first conductive layer GMP1 may be a first gate metal pattern, the second conductive layer GMP2 may be a second gate metal pattern, the third conductive layer GMP3 may be a third gate metal pattern, the fourth conductive layer DMP1 may be a first data metal pattern, and the fifth conductive layer DMP2 may be a second data metal pattern, however, embodiments should not be limited thereto or thereby.

In an embodiment of the disclosure, each of the first gate insulating layer GI1, the second gate insulating layer GI2, the first interlayer insulating layer ILD1, and the second interlayer insulating layer ILD2 may include an organic layer and/or an inorganic layer. In an embodiment of the disclosure, each of the first gate insulating layer GI1, the second gate insulating layer GI2, the first interlayer insulating layer ILD1, and the second interlayer insulating layer ILD2 may include inorganic thin layers. The inorganic thin layers may include a silicon nitride layer and a silicon oxide layer.

In an embodiment of the disclosure, each of the first via layer VIA1 and the second via layer VIA2 may include an organic material. In an embodiment of the disclosure, each of the first gate metal pattern GMP1, the second gate metal pattern GMP2, and the third gate metal pattern GMP3 may include molybdenum (Mo), however, embodiments should not be limited thereto or thereby.

In an embodiment of the disclosure, each of the first data metal pattern DMP1 and the second data metal pattern DMP2 may include at least one of aluminum (Al) and titanium (T1), however, embodiments should not be limited thereto or thereby. In an embodiment of the disclosure, each of the first data metal pattern DMP1 and the second data metal pattern DMP2 may have a stack structure in which titanium, aluminum, and titanium may be stacked (e.g., sequentially stacked).

The first buffer layer BFL1 may be disposed on the base layer BL. The second buffer layer BFL2 may be disposed on the first buffer layer BFL1. Each of the first buffer layer BFL1 and the second buffer layer BFL2 may prevent impurities existing in the base layer BL from entering the pixel PX. In particular, each of the first buffer layer BFL1 and the second buffer layer BFL2 may prevent the impurities from diffusing to the semiconductor layer ACP of the transistors T1 to T7 of the pixel PX.

The impurities may be introduced from the outside or may be caused by thermal decomposition of the base layer BL. The impurities may be sodium or gas discharged from the base layer BL. Each of the first buffer layer BFL1 and the second buffer layer BFL2 may prevent moisture from entering into the pixel PX. According to another embodiment of the disclosure, at least one of the first buffer layer BFL1 and the second buffer layer BFL2 may be omitted.

The semiconductor layer ACP may be disposed on the second buffer layer BFL2. The semiconductor layer ACP may form each of the transistors T1 to T7. The semiconductor layer ACP may include polysilicon, amorphous silicon, a metal oxide semiconductor, or a combination thereof. FIG. 6A shows a semiconductor pattern forming a source S1, an active region A1, and a drain D1 of the first transistor T1 and a semiconductor pattern forming a source S2, an active region A2, and a drain D2 of the second transistor T2. In FIG. 6B, two semiconductor patterns are shown to be spaced apart from each other, however, the two semiconductor patterns may have an integral shape in a plan view as shown in FIG. 5A. The first gate insulating layer GI1 may be disposed on the second buffer layer BFL2 and may cover the semiconductor layer ACP. The first gate metal pattern GMP1 may be disposed on the first gate insulating layer GI1. A gate G1 of the first transistor T1 and a gate G2 of the second transistor T2 are shown as the first gate metal pattern GMP1. Although not shown separately, the first gate metal pattern GMP1 may include one electrode of two electrodes forming the capacitor CP of the pixel PX.

The second gate insulating layer GI2 may be disposed on the first gate insulating layer GI1 and may cover the first gate metal pattern GMP1. The second gate metal pattern GMP2 may be disposed on the second gate insulating layer GI2. The second gate metal pattern GMP2 may be the other electrode of the two electrodes forming the capacitor CP. An upper electrode UE is shown as the second gate metal pattern GMP2. An opening UE-OP may be defined through the upper electrode UE.

The first interlayer insulating layer ILD1 may be disposed on the second gate insulating layer GI2 and may cover the second gate metal pattern GMP2. The third gate metal pattern GMP3 may be disposed on the first interlayer insulating layer ILD1. Two connection electrodes CNE-G3 are shown as the third gate metal pattern GMP3 as a representative example. One connection electrode CNE-G3 may be electrically connected to the gate G1 of the first transistor T1 through a contact hole CH10 defined through the second gate insulating layer GI2 and the first interlayer insulating layer ILD1. The contact hole CH10 may pass through the opening UE-OP. The other connection electrode CNE-G3 may be electrically connected to the source S2 of the second transistor T2 through a contact hole CH20 that may be defined through the first gate insulating layer GI1, the second gate insulating layer GI2, and the first interlayer insulating layer ILD1. Although not shown in FIG. 6A, the third gate metal pattern GMP3 may include the second power line VL. The second interlayer insulating layer ILD2 may be disposed on the first interlayer insulating layer ILD1 and may cover the third gate metal pattern GMP3. The first data metal pattern DMP1 may be disposed on the second interlayer insulating layer ILD2. Two connection electrodes CNE-D1 are shown as the first data metal pattern DMP1. The two connection electrodes CNE-D1 may be respectively electrically connected to the two connection electrodes CNE-G3 through contact holes CH11 and CH21 defined through the second interlayer insulating layer ILD2. The connection electrodes CNE-G3 of the third gate metal pattern GMP3 may be omitted, and in this case, the two connection electrodes CNE-D1 of the first data metal pattern DMP1 may be respectively connected to the gate G1 of the first transistor T1 and the source S2 of the second transistor T2.

The first via layer VIA1 may be disposed on the second interlayer insulating layer ILD2 and may cover the first data metal pattern DMP1. The second data metal pattern DMP2 may be disposed on the first via layer VIA1. One connection electrode CNE-D2 is shown as the second data metal pattern DMP2 as a representative example. The connection electrode CNE-D2 may be connected to the connection electrodes CNE-D1 through a contact hole CH22 defined through the first via layer VIA1.

The second via layer VIA2 may be disposed on the first via layer VIA1 and may cover the second data metal pattern DMP2. The light emitting element layer ELL may include the light emitting element LD and a pixel definition layer PDL. The light emitting element LD may include the anode electrode AE, a light emitting layer EML, and a cathode electrode CE.

The anode electrode AE may be disposed on the second via layer VIA2. The anode electrode AE may be electrically connected to the second data metal pattern DMP2 through a contact hole. The pixel definition layer PDL may be disposed on the second via layer VIA2 and may expose at least a portion of the anode electrode AE. The light emitting layer EML may be disposed on the anode electrode AE. The cathode electrode CE may be disposed on the light emitting layer EML.

In a case where the light emitting element LD may be an organic light emitting diode (OLED), the light emitting layer EML may include an organic material. According to another embodiment of the disclosure, in a case where the light emitting element LD may be a micro LED, the light emitting layer EML may include an inorganic material. An encapsulation layer TFE may encapsulate the light emitting element layer ELL to protect the light emitting element layer ELL from external oxygen or moisture. The encapsulation layer TFE may be a layer obtained by stacking the organic layer and the inorganic layer.

Referring to the non-active area NACA of FIGS. 6A and 6B, a signal line LNC may be disposed according to areas. The signal line LNC may be the second data metal pattern DMP2.

The first buffer layer BFL1, the second buffer layer BFL2, the first gate insulating layer GI1, the second gate insulating layer GI2, the first interlayer insulating layer ILD1, and the second interlayer insulating layer ILD2 may not be disposed in a portion corresponding to the bending area BA. In FIGS. 6A and 6B, an opening OP may be formed from the first buffer layer BFL1 to the second interlayer insulating layer ILD2. The opening OP may overlap or correspond to the bending area BA. The opening OP defined by two stepped portions is shown. In the case of the opening OP defined by two stepped portions, an inclination surface that defines the opening OP may be stepped.

Since only the first via layer VIA1 and the second via layer VIA2 may be disposed in the portion corresponding to the bending area BA, a flexibility of the bending area BA may be improved.

Figure 7A:
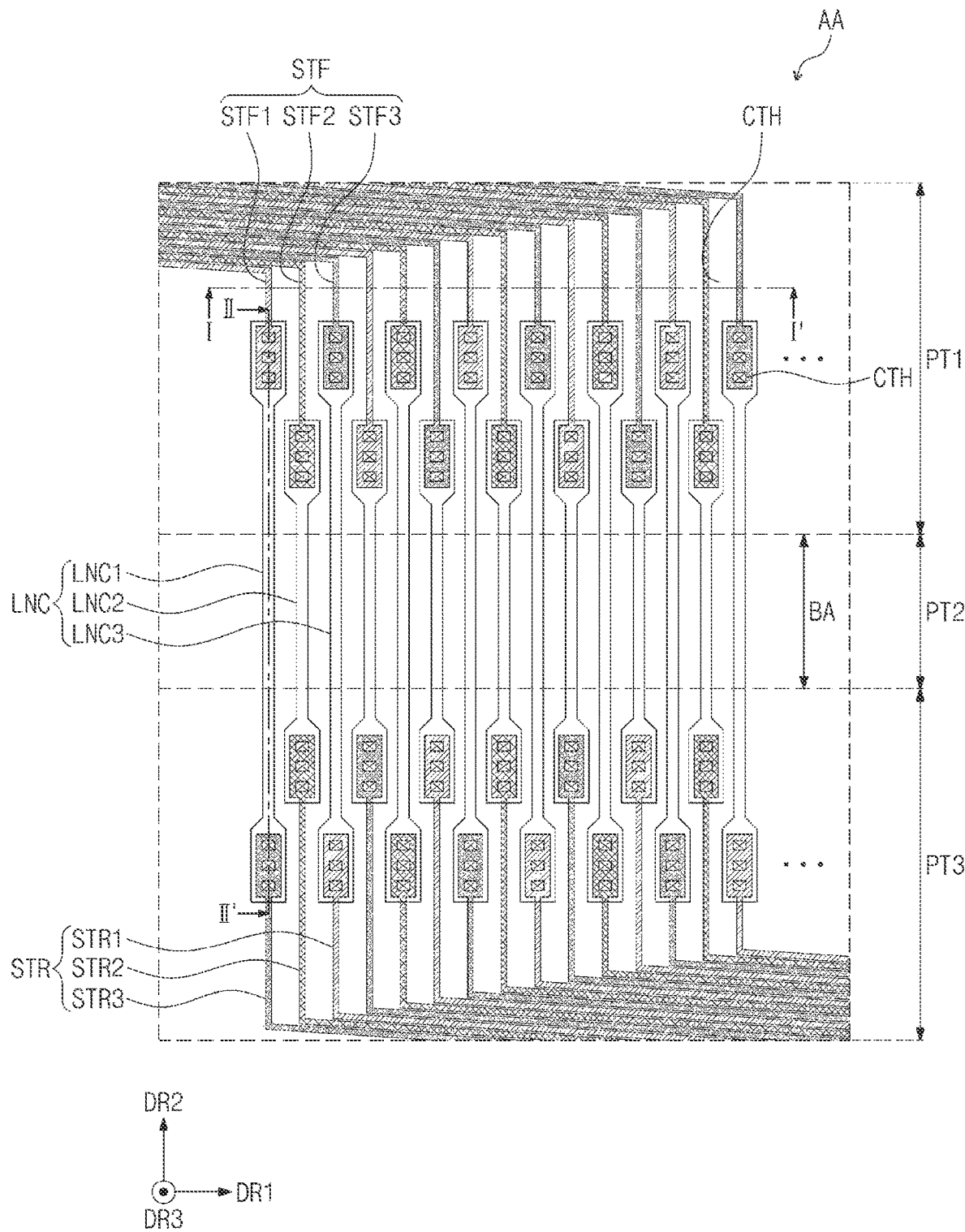
FIG. 7A is an enlarged schematic view showing area AA of FIG. 2.
Figure 7B:
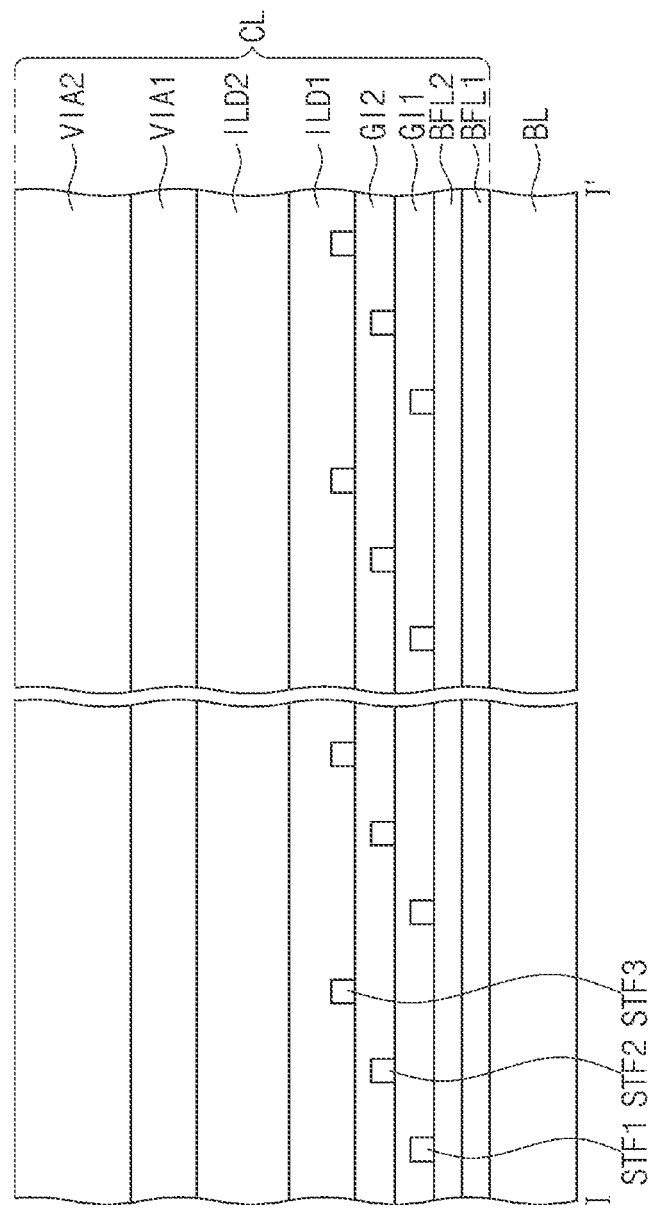
FIG. 7B is a schematic cross-sectional view taken along line I-I' of FIG. 7A.
Figure 7D:
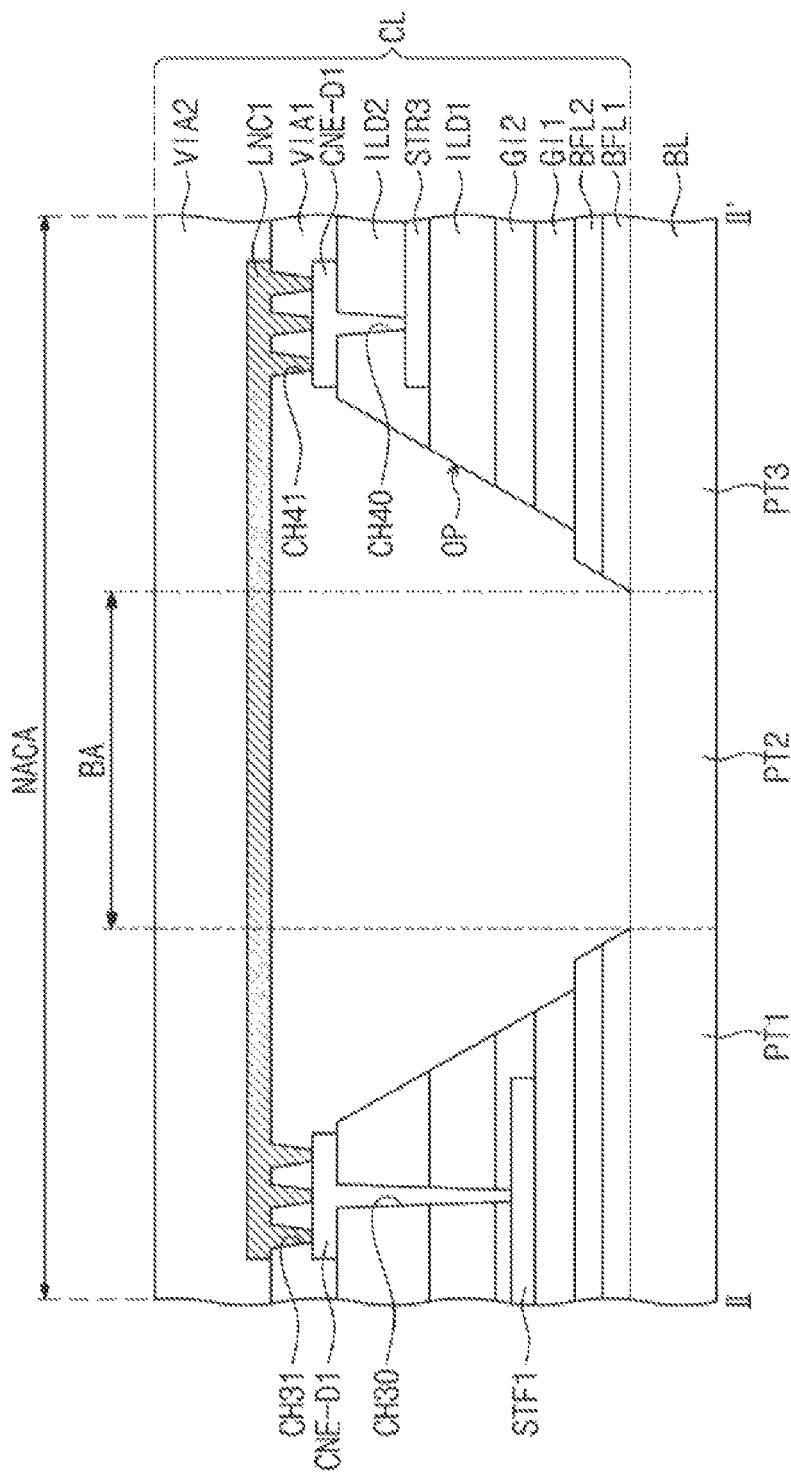
FIG. 7D is a schematic cross-sectional view taken along line II-IF of FIG. 7A.

FIG. 7A is an enlarged schematic view showing area AA of FIG. 2. FIG. 7B is a schematic cross-sectional view taken along line I-I' of FIG. 7A. FIGS. 7C and 7D are schematic cross-sectional views taken along line II-IF of FIG. 7A. FIGS. 8A, 8B, 8C, and 8D are views schematically showing lines STF, LNC, and STR shown in FIG. 7A by each layer.

Front signal lines STF may be disposed on the first portion PT1 of the base layer BL. The front signal lines STF may be electrically connected to the pixels PX. The front signal lines STF may include first front signal lines STF1, second front signal lines STF2, and third front signal lines STF3. The first front signal lines STF1, the second front signal lines STF2, and the third front signal lines STF3 may be disposed on different layers from each other. A portion on which the front signal lines STF are disposed may be referred to as a spider line portion. Rear signal lines STR may be disposed on the third portion PT3 of the base layer BL. The rear signal lines STR may be electrically connected to the data driving circuit DIC. The rear signal lines STR may include first rear signal lines STR1, second rear signal lines STR2, and third rear signal lines STR3. The first rear signal lines STR1, the second rear signal lines STR2, and the third rear signal lines STR3 may be disposed on different layers from each other. Connection lines LNC (or connection signal lines) may be disposed on the second portion PT2 of the base layer BL to electrically connect the front signal lines STF and the rear signal lines STR. The connection lines LNC may include first connection lines LNC1, second connection lines LNC2, and third connection lines LNC3.

The front signal lines STF and the rear signal lines STR may include a first metal material, and the connection lines LNC may include a second metal material. The first metal material may have a specific resistance greater than a specific resistance of the second metal material. The first metal material may include molybdenum (Mo). The second metal material may include at least one of aluminum (Al) and titanium (Ti).

Figure 8A:
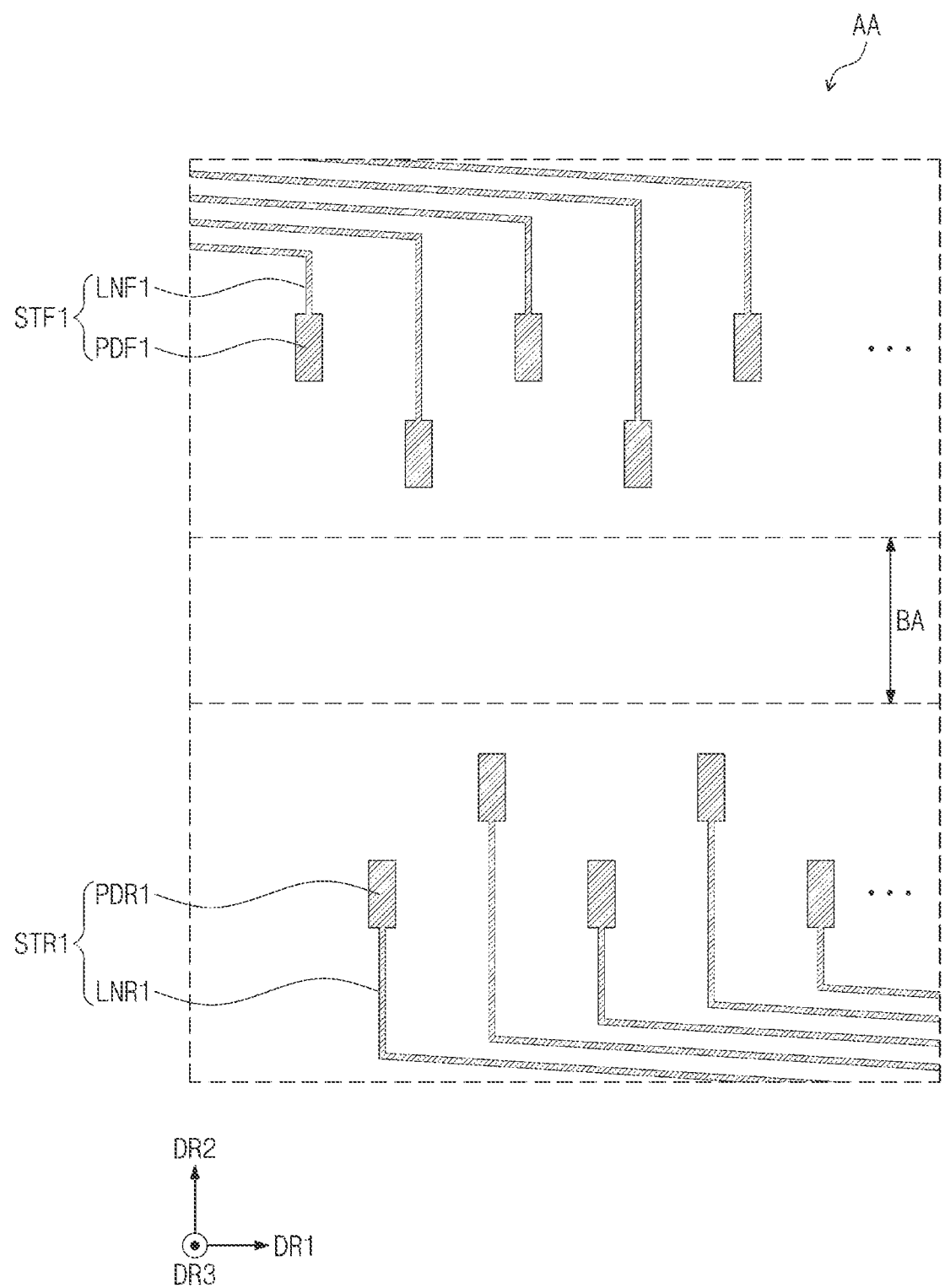
FIGS. 8A, 8B, 8C, and 8D are views schematically showing lines shown in FIG. 7A by each layer.

Referring to FIGS. 7B and 8A, the first front signal lines STF1 and the first rear signal lines STR1 may be disposed on the same layer. The first front signal lines STF1 and the first rear signal lines STR1 may be disposed on the same layer as the first gate metal pattern GMP1.

The first front signal line STF1 may include a line portion LNF1 and a pad portion PDF1. The first rear signal line STR1 may include a line portion LNR1 and a pad portion PDR1.

Figure 8B:
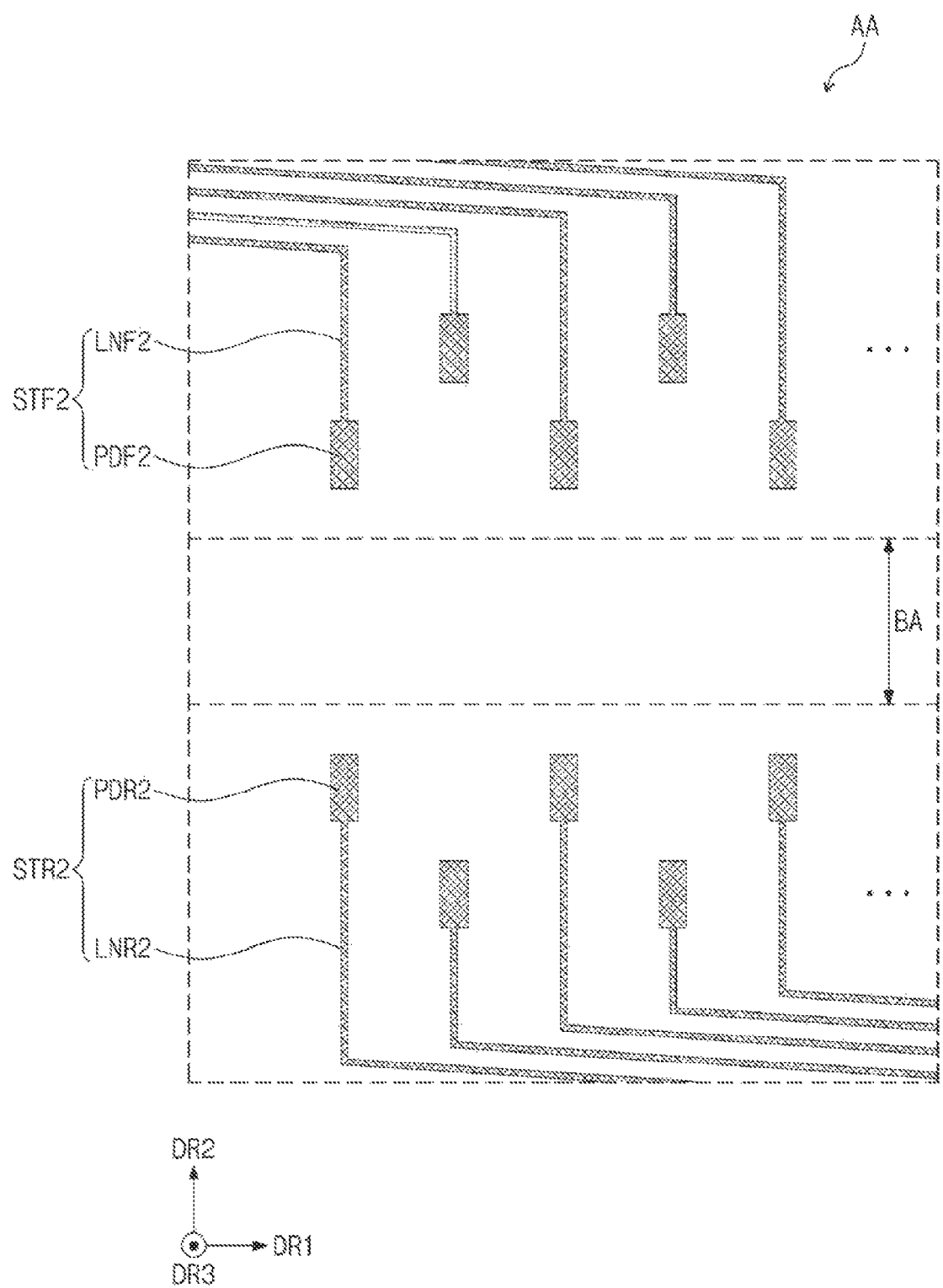

Referring to FIGS. 7B and 8B, the second front signal lines STF2 and the second rear signal lines STR2 may be disposed on the same layer. The second front signal lines STF2 and the second rear signal lines STR2 may be disposed on the same layer as the second gate metal pattern GMP2.

The second front signal line STF2 may include a line portion LNF2 and a pad portion PDF2. The second rear signal line STR2 may include a line portion LNR2 and a pad portion PDR2.

Figure 8C:
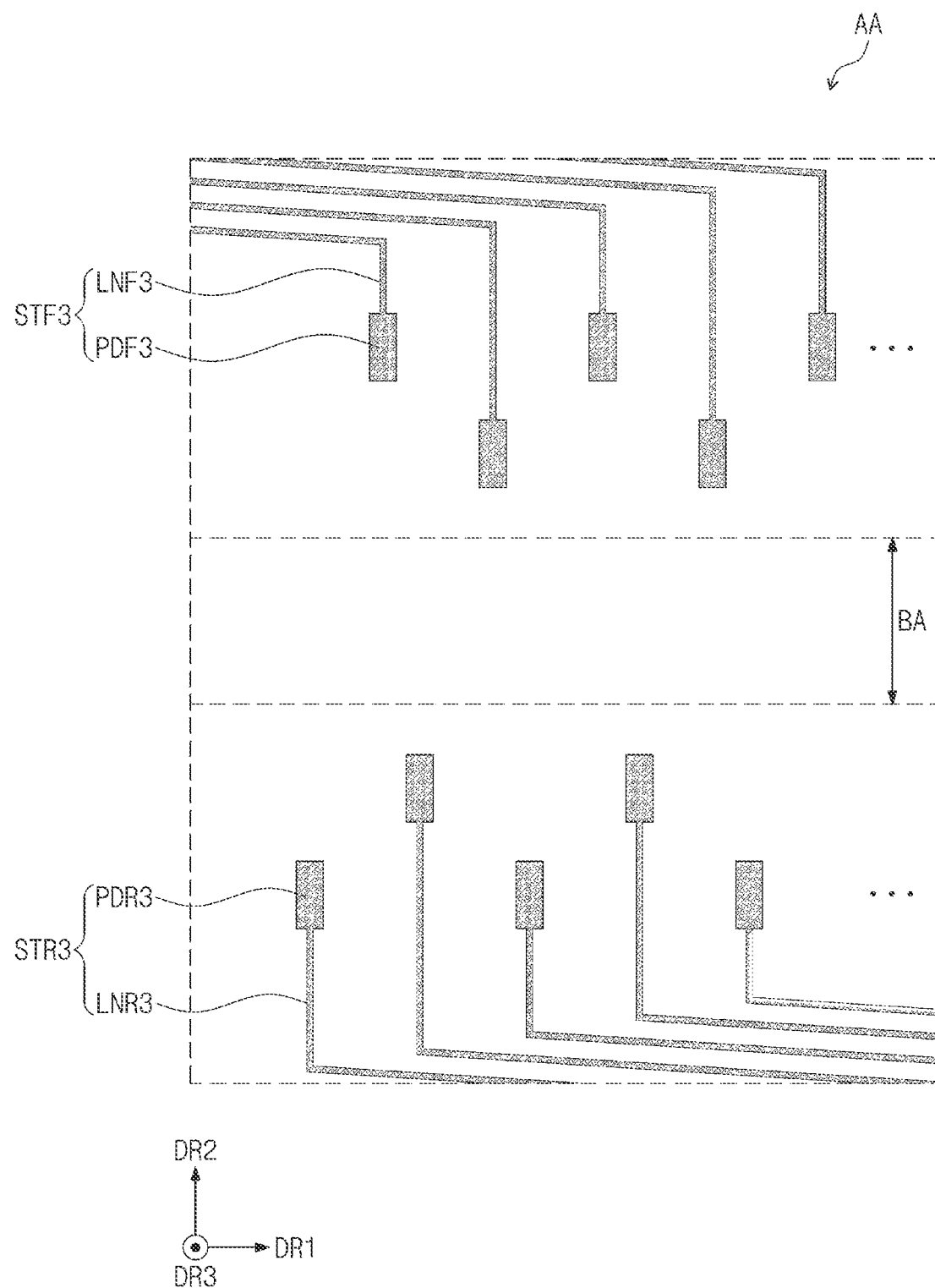

Referring to FIGS. 7B and 8C, the third front signal lines STF3 and the third rear signal lines STR3 may be disposed on the same layer. The third front signal lines STF3 and the third rear signal lines STR3 may be disposed on the same layer as the third gate metal pattern GMP3.

Each of the third front signal lines STF3 may include a line portion LNF3 and a pad portion PDF3. Each of the third rear signal lines STR3 may include a line portion LNR3 and a pad portion PDR3.

Figure 8D:
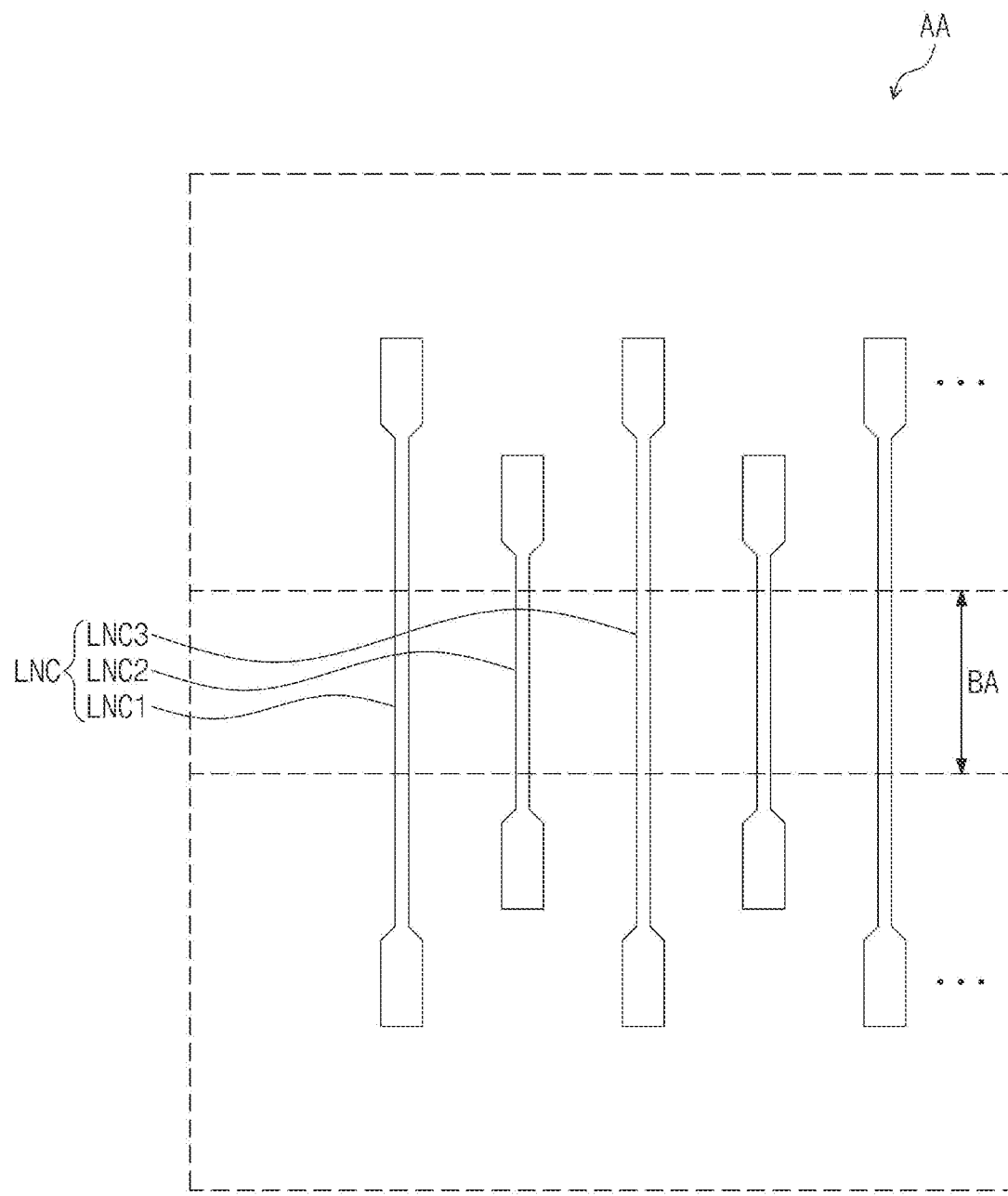

Referring to FIG. 8D, the connection lines LNC may be disposed on the same layer as the second data metal pattern DMP2, however, embodiments should not be limited thereto or thereby. According to another embodiment of the disclosure, the connection lines LNC may be disposed on the same layer as the first data metal pattern DMP1.

As shown in FIGS. 7A and 7C, the first connection lines LNC1 may be connected to the first front signal lines STF1 through contact holes CTH and may be electrically connected to the third rear signal lines STR3 through the contact holes CTH. As shown in FIG. 7C, the contact hole CTH through which the first connection line LNC1 may be connected to the first front signal line STF1 may penetrate through from the second gate insulating layer GI2 to the first via layer VIA1 The contact hole CTH through which the first connection line LNC1 may be connected to the third rear signal line STR3 may penetrate through from the second interlayer insulating layer ILD2 to the first via layer VIA1 The second connection lines LNC2 may be electrically connected to the second front signal lines STF2 and the second rear signal lines STR2 through contact holes CTH. The third connection lines LNC3 may be electrically connected to the third front signal lines STF3 and the first rear signal lines STR1 through contact holes CTH.

As shown in FIG. 7D, the first connection line LNC1 may be connected to the first front signal line STF1 by the connection electrode CNE-D1 and may be connected to the third rear signal line STR3 by the connection electrode CNE-D1. One connection electrode CNE-D1 may be connected to the first front signal line STF1 through a contact hole CH30 defined through from the second gate insulating layer GI2 to the second interlayer insulating layer ILD2, and the other connection electrode CNE-D1 may be connected to the third rear signal line STR3 through a contact hole CH40 defined through the second interlayer insulating layer ILD2. The first connection line LNC1 may be connected to the two connection electrodes CNE-D1 thorough contact holes CH31 and CH41 defined through the first via layer VIA1. The number of the contact holes CH30, CH31, CH40, and CH41 should not be particularly limited, and each of the contact holes CH30, CH31, CH40, and CH41 may be provided in a singular or plural number.

The front signal lines STF may have different widths and/or different thicknesses from each other. For example, in a direction substantially parallel to the first direction axis DR1, signal lines disposed at an outer side among the front signal lines STF may have a larger width or a greater thickness than signal lines disposed at an inner side among the front signal lines STF.

The rear signal lines STR may have different widths and/or different thicknesses from each other. For example, in the direction substantially parallel to the first direction axis DR1, signal lines disposed at an outer side among the rear signal lines STR may have a larger width or a greater thickness than signal lines disposed at an inner side among the rear signal lines STR.

The connection lines LNC may have different widths and/or different thicknesses from each other. For example, in the direction substantially parallel to the first direction axis DR1, signal lines disposed at an outer side among the connection lines LNC may have a larger width or a greater thickness than signal lines disposed at an inner side among the connection lines LNC.

Since the signal line disposed at the outer side has a length longer than that of the signal line disposed at the inner side, a difference in resistance between the signal lines may be reduced by allowing the signal line disposed at the outer side to have the larger width and the greater thickness than the signal line disposed at the inner side.

Figure 9:
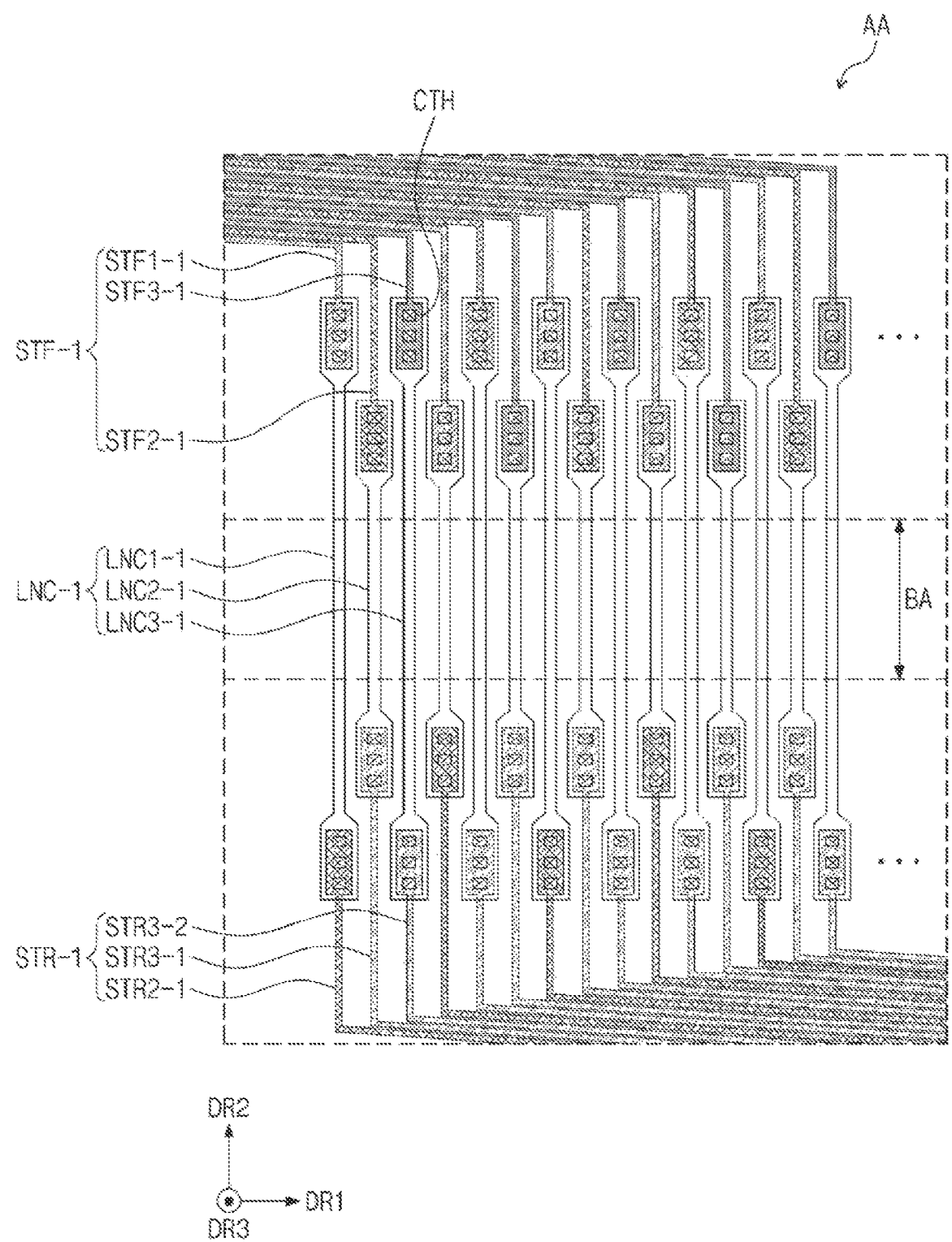
FIG. 9 is an enlarged view schematically showing area AA of FIG. 2.

FIG. 9 is an enlarged view schematically showing area AA of FIG. 2. FIGS. 10A, 10B, 10C, and 10D are views schematically showing lines STF-1, LNC-1, and STR-1 shown in FIG. 9 by each layer.

Front signal lines STF-1 may be disposed on the first portion PT1 of the base layer BL. The front signal lines STF-1 may include first front signal lines STF1-1, second front signal lines STF2-1, and third front signal lines STF3-1. The first front signal lines STF1-1, the second front signal lines STF2-1, and the third front signal lines STF3-1 may be disposed on different layers from each other.

The front signal lines STF-1 may be electrically connected to pixels PX.

Rear signal lines STR-1 may be disposed on the third portion PT3 of the base layer BL. The rear signal lines STR-1 may include second rear signal lines STR2-1 and third rear signal lines STR3-1 and STR3-2. The third rear signal lines STR3-1 and STR3-2 may include first group lines STR3-1 and second group lines STR3-2.

The second rear signal lines STR2-1 and the third rear signal lines STR3-1 and STR3-2 may be disposed on different layers from each other.

The rear signal lines STR-1 may be electrically connected to the data driving circuit DIC.

Connection lines LNC-1 may be disposed on the second portion PT2 of the base layer BL to electrically connect the front signal lines STF-1 and the rear signal lines STR-1. The connection lines LNC-1 may include first connection lines LNC1-1, second connection lines LNC2-1, and third connection lines LNC3-1.

Figure 10A:
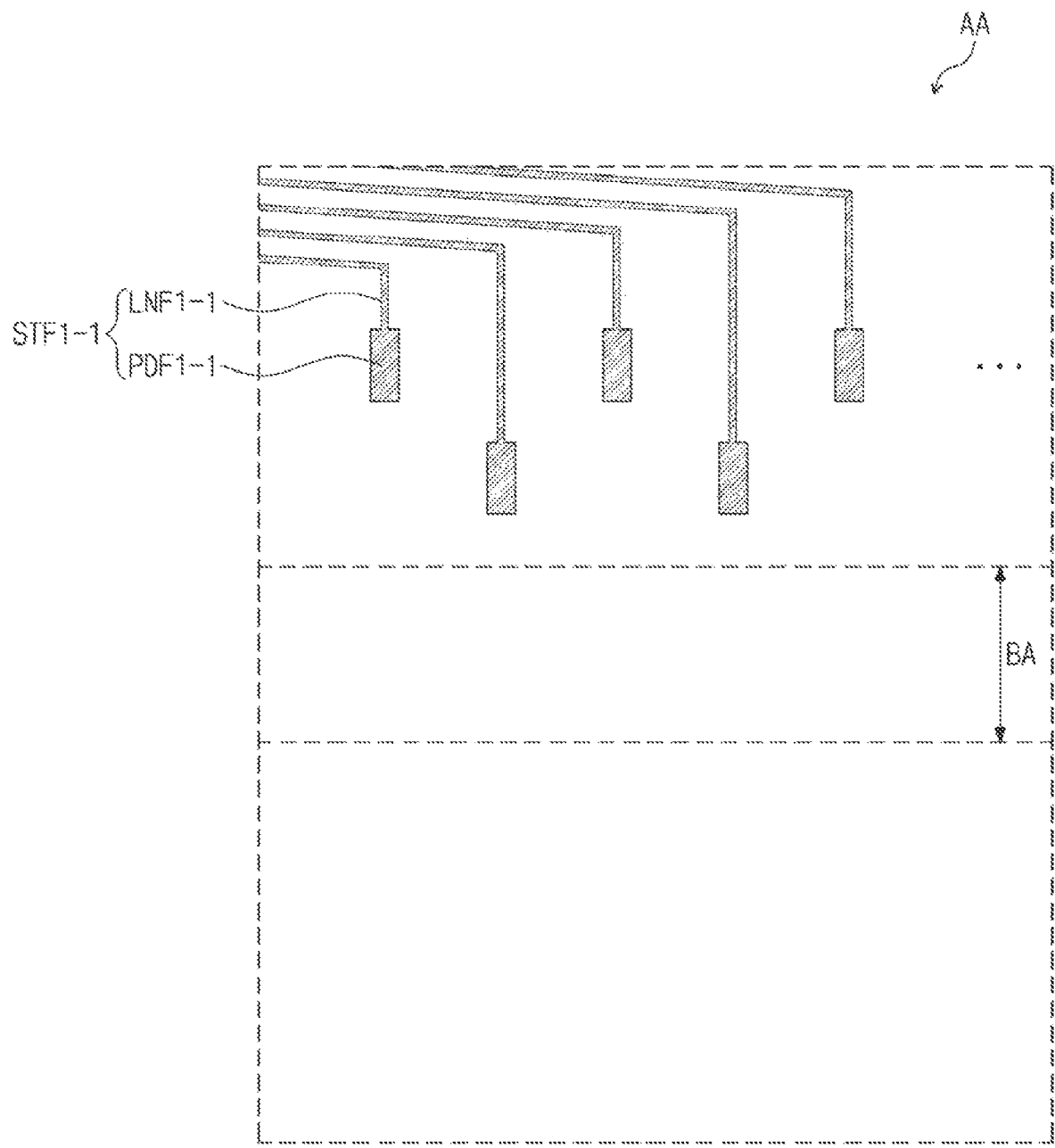
FIGS. 10A, 10B, 10C, and 10D are views schematically showing lines shown in FIG. 9 by each layer.

Referring to FIG. 10A, the first front signal lines STF1-1 may be disposed on the same layer as the first gate metal pattern GMP1.

Each of the first front signal lines STF1-1 may include a line portion LNF1-1 and a pad portion PDF1-1.

Figure 10B:
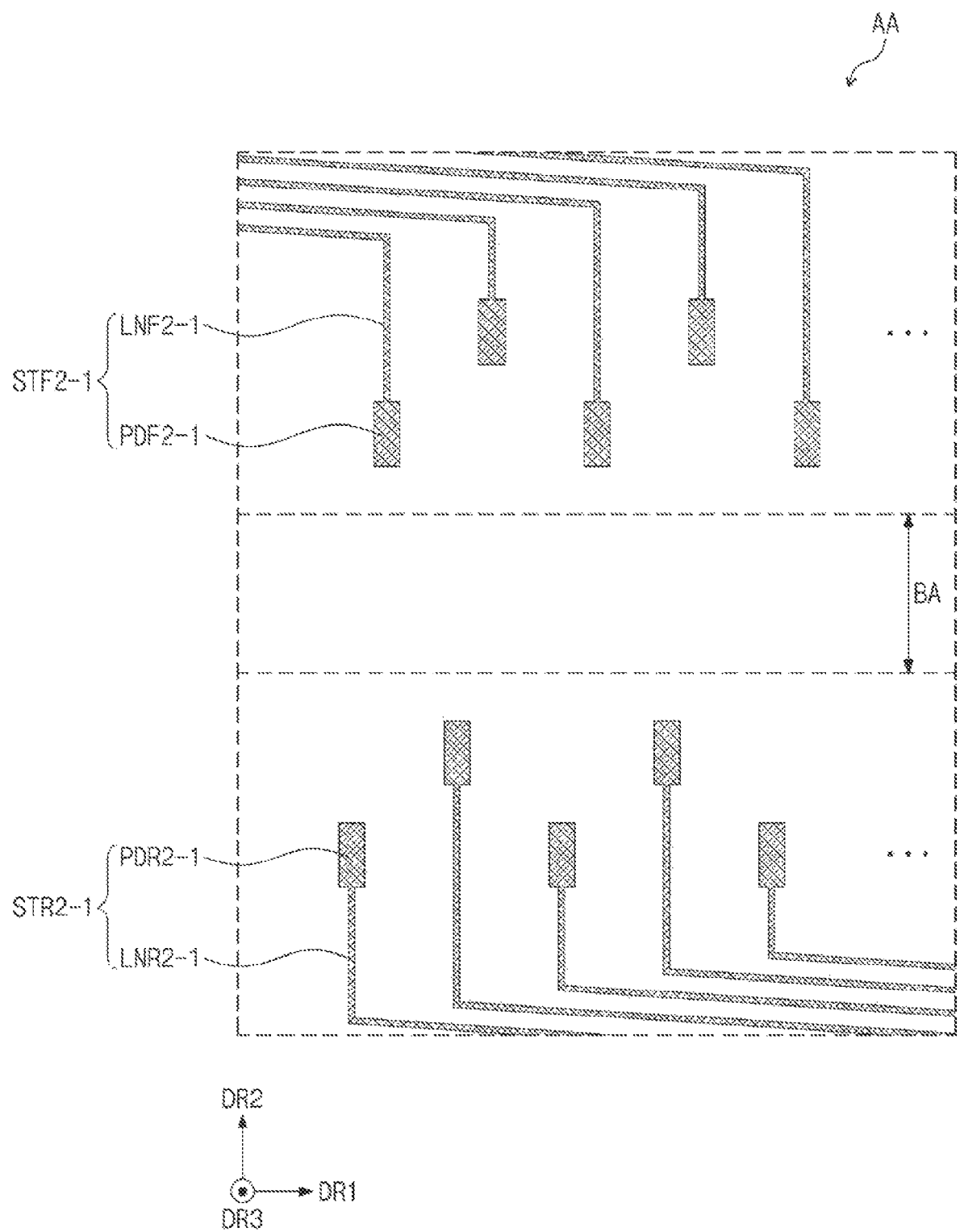

Referring to FIG. 10B, the second front signal lines STF2-1 and the second rear signal lines STR2-1 may be disposed on the same layer as each other. The second front signal lines STF2-1 and the second rear signal lines STR2-1 may be disposed on the same layer as the second gate metal pattern GMP2.

The second front signal lines STF2-1 may include a line portion LNF2-1 and a pad portion PDF2-1. The second rear signal lines STR2-1 may include a line portion LNR2-1 and a pad portion PDR2-1.

Figure 10C:
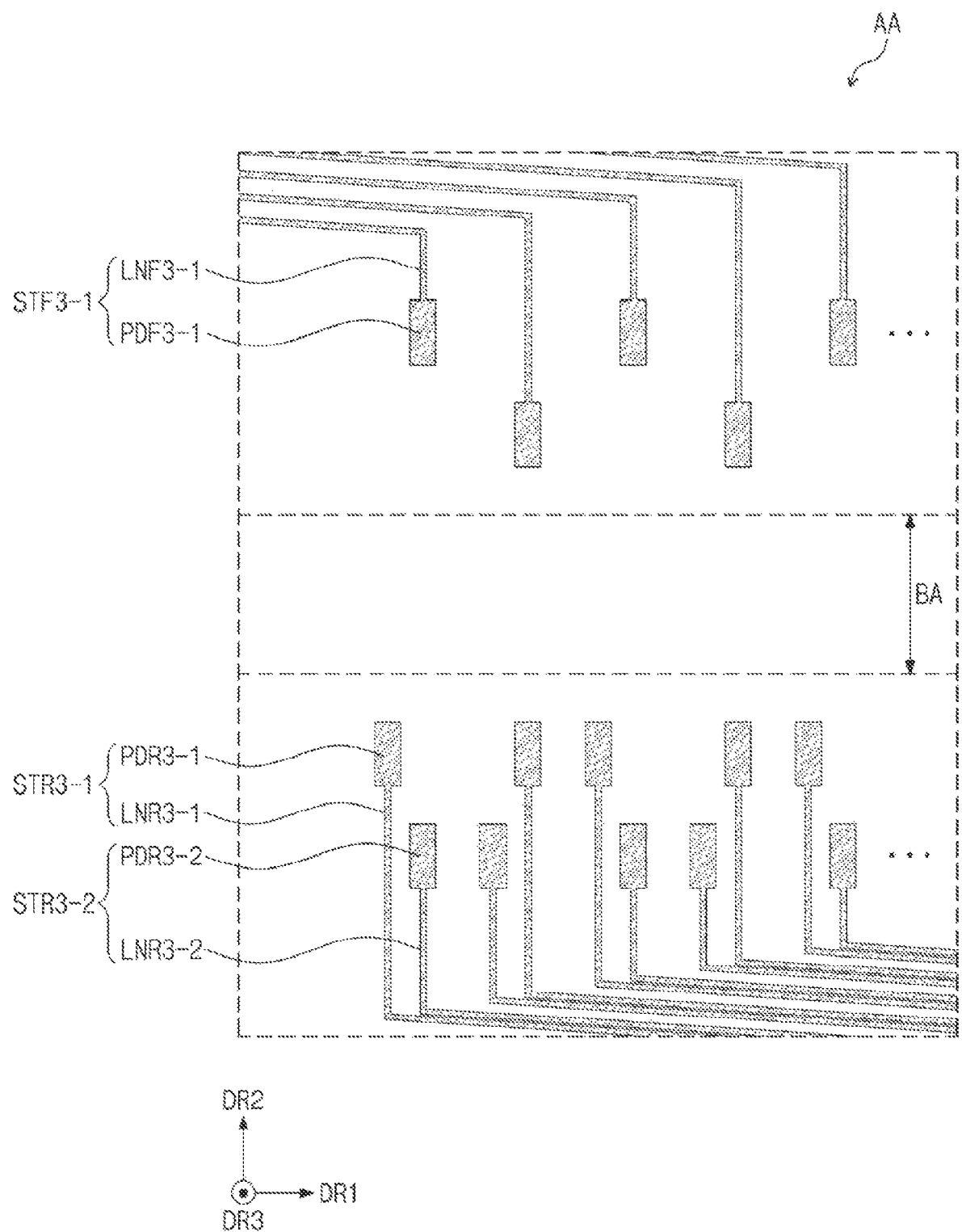

Referring to FIG. 10C, the third front signal lines STF3-1 and the third rear signal lines STR3-1 and STR3-2 may be disposed on the same layer as each other. The third front signal lines STF3-1 and the third rear signal lines STR3-1 and STR3-2 may be disposed on the same layer as the third gate metal pattern GMP3.

The third front signal lines STF3-1 may include a line portion LNF3-1 and a pad portion PDF3-1. First group lines STR3-1 may include a line portion LNR3-1 and a pad portion PDR3-1. Second group lines STR3-2 may include a line portion LNR3-2 and a pad portion PDR3-2.

Figure 10D:
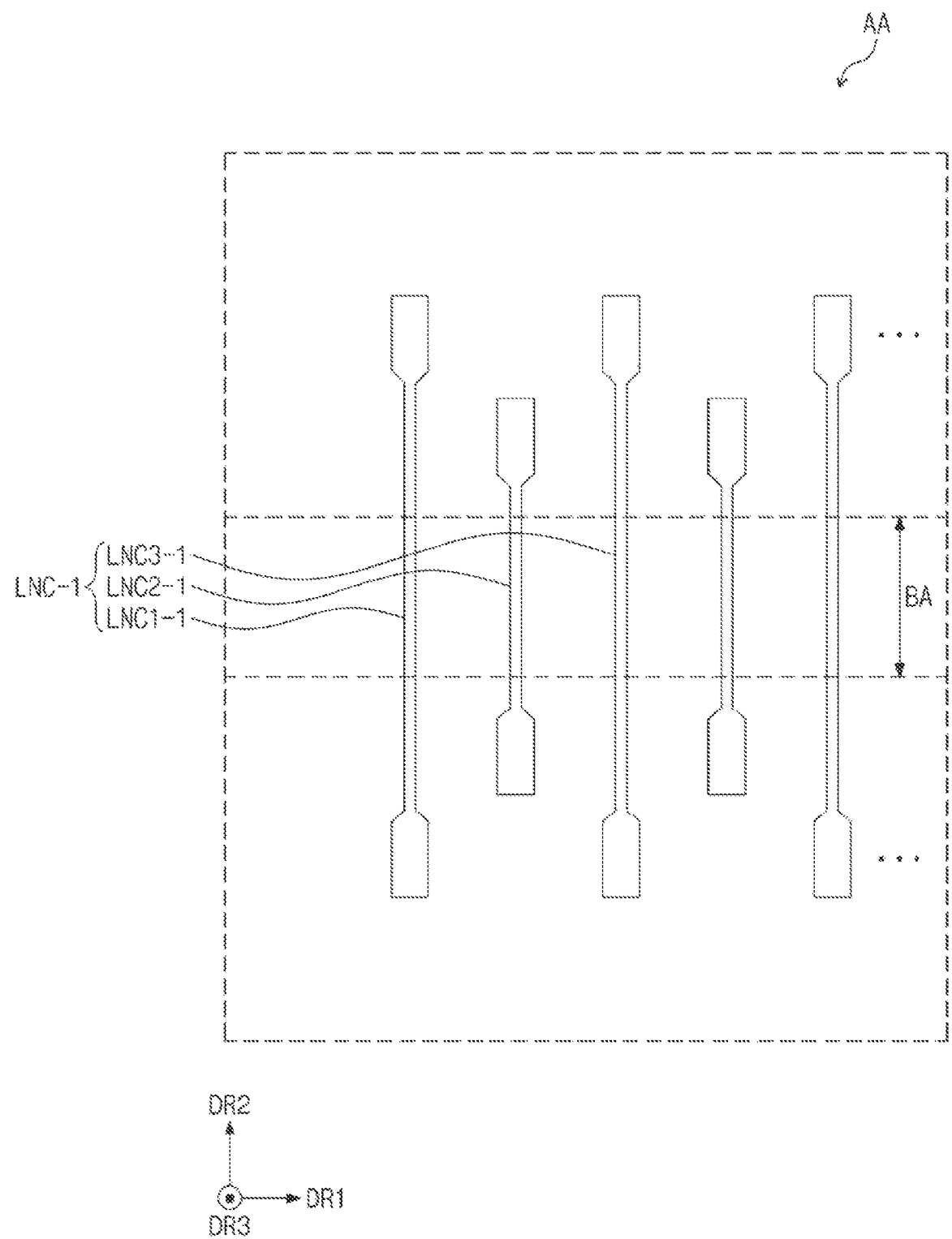

Referring to FIG. 10D, the connection lines LNC-1 may be disposed on the same layer as the second data metal pattern DMP2, however, embodiments should not be limited thereto or thereby. According to another embodiment of the disclosure, the connection lines LNC-1 may be disposed on the same layer as the first data metal pattern DMP1.

The first connection lines LNC1-1 may be electrically connected to the first front signal lines STF1-1 and the second rear signal lines STR2-1 through contact holes CTH. For example, the first connection lines LNC1-1 may electrically connect the first front signal lines STF1-1 and the second rear signal lines STR2-1.

The second connection lines LNC2-1 may be electrically connected to the second front signal lines STF2-1 and the first group lines STR3-1 through contact holes CTH. For example, the second connection lines LNC2-1 may electrically connect the second front signal lines STF2-1 and the first group lines STR3-1.

The third connection lines LNC3-1 may be electrically connected to the third front signal lines STF3-1 and the second group lines STR3-2 through contact holes CTH. For example, the third connection lines LNC3-1 may electrically connect the third front signal lines STF3-1 and the second group lines STR3-2.

Figure 11:
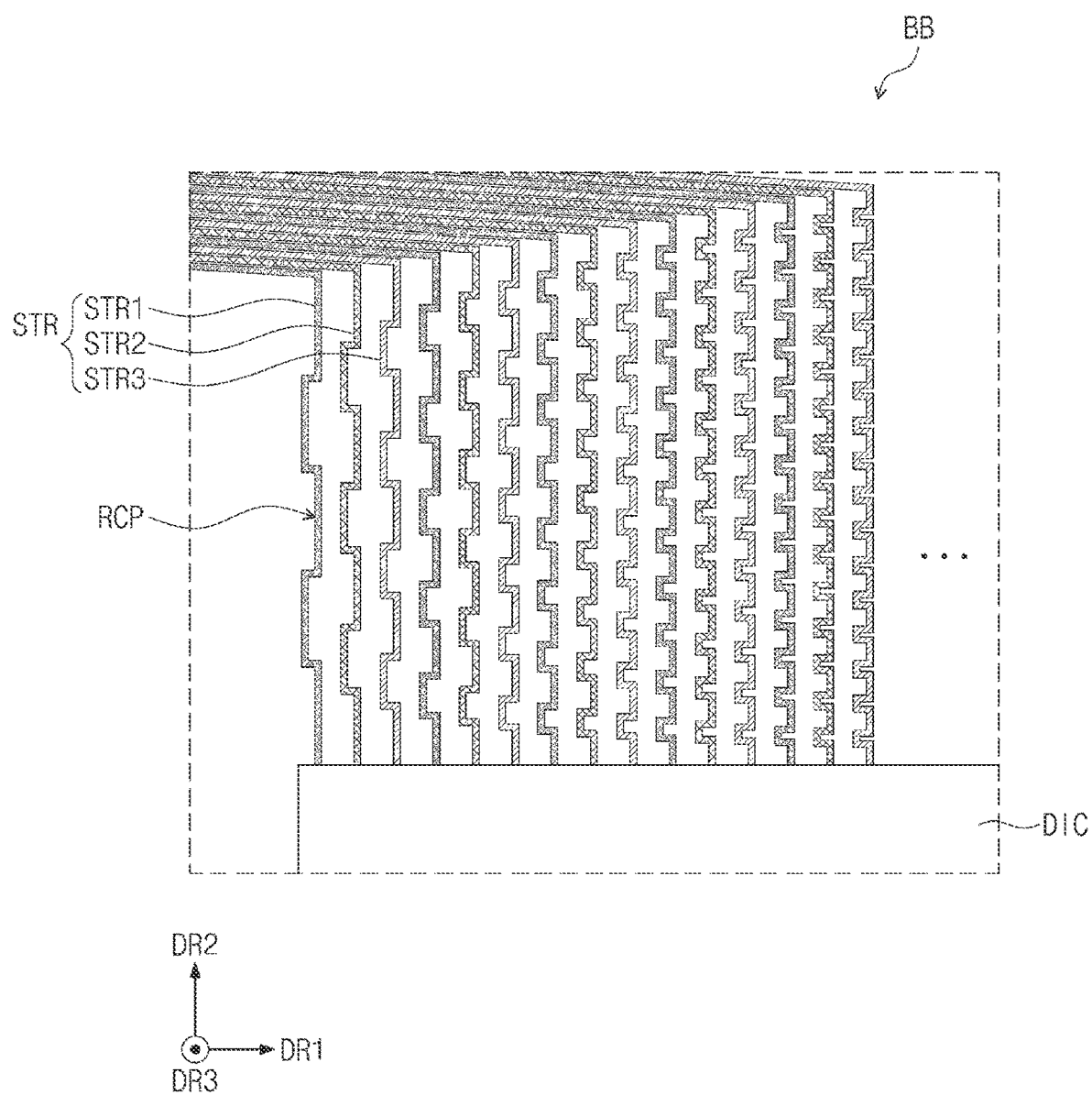
FIG. 11 is an enlarged view schematically showing area BB of FIG. 2.

FIG. 11 is an enlarged view schematically showing area BB of FIG. 2.

The rear signal lines STR may include resistance control portions RCP. The resistance control portions RCP may be a signal line having a zigzag shape.

A density of the zigzag pattern of the resistance control portions RCP disposed at an outer side among the resistance control portions RCP may be smaller than a density of the zigzag pattern of the resistance control portions RCP disposed at an inner side among the resistance control portions RCP.

Since the signal line disposed at the outer side may be longer than the signal line disposed at the inner side, the difference in resistance between the signal lines may be reduced by allowing the density of the zigzag pattern of the resistance control portion of the signal line disposed at the outer side to be relatively low.

Although embodiments of the disclosure have been described, it is understood that the disclosure should not be limited to these embodiments but various changes and modifications can be made by one ordinary skilled in the art within the spirit and scope of the disclosure as hereinafter claimed. Therefore, the disclosed subject matter should not be limited to any single embodiment described herein, and the scope of the inventive concept shall be determined according to the attached claims, including any equivalents.

What is claimed is:

1. A display device comprising:
    a display area in which pixels are disposed and a non-display area in which the pixels are not disposed,
    wherein the display device comprises:
        a base layer including a first portion overlapping the display area, a second portion extending from the first portion, being bent, and overlapping the non-display area, and a third portion extending from the second portion; and
        wherein the pixels comprise a first pixel, a second pixel, and a third pixel,
    wherein the first pixel, the second pixel, and the third pixel include a first light emitting element, a second light emitting element, and a third light emitting element, respectively, and
        a first front signal line disposed on the first portion and electrically connected to the first pixel;
        a second front signal line disposed on the first portion and electrically connected to the second pixel, wherein the first front signal line and the second front signal line are disposed on different layers;
        a third front signal line electrically connected to the third pixel, wherein the first front signal line, the second front signal line, and the third front signal line are disposed on different layers, wherein the second front signal line is disposed between the first front signal line and the third front signal line in a plan view, and the second front signal line is spaced apart from the first front signal line and the third front signal line;
        a first rear signal line disposed on the third portion, wherein the first rear signal line and the first front signal line are disposed on a same layer;
        a second rear signal line disposed on the third portion, wherein the second rear signal line and the second front signal line are disposed on a same layer;
        a third rear signal line disposed on the third portion, wherein the third rear signal line and the third front signal line are disposed on a same layer; and
        connection lines that overlap the second portion, wherein at least one of the connection lines electrically connects the first front signal line and the third rear signal line,
    wherein
        each of the first rear signal line, the second rear signal line, and the third rear signal line is provided in a plural number, and
        rear signal lines disposed at an outer side among the first rear signal lines, the second rear signal lines, and the third rear signal lines have a larger width than rear signal lines disposed at an inner side among the first rear signal lines, the second rear signal lines, and the third rear signal lines.

2. The display device of claim 1, further comprising a data driving circuit disposed on the third portion of the base layer, wherein the data driving circuit is electrically connected to the first rear signal line, the second rear signal line, and the third rear signal line.

3. The display device of claim 1, wherein
    each of the first front signal line, the second front signal line, the third front signal line, the first rear signal line, the second rear signal line, and the third rear signal line comprises a first metal material, and
    each of the connection lines comprises a second metal material different from the first metal material.

4. The display device of claim 3, wherein the first metal material has a specific resistance greater than a specific resistance of the second metal material.

5. The display device of claim 3, wherein the first metal material comprises molybdenum, and the second metal material comprises aluminum.

6. The display device of claim 1, wherein the connection lines comprise:
    a first connection line electrically connecting the first front signal line and the third rear signal line;
    a second connection line electrically connecting the second front signal line and the second rear signal line; and
    a third connection line electrically connecting the third front signal line and the first rear signal line.

7. The display device of claim 1, wherein
    each of the first front signal line, the second front signal line, and the third front signal line is provided in a plural number, and
    front signal lines disposed at an outer side among the first front signal lines, the second front signal lines, and the third front signal lines have a larger width than front signal lines disposed at an inner side among the first front signal lines, the second front signal lines, and the third front signal lines.

8. The display device of claim 7, wherein the front signal lines disposed at the outer side have a greater thickness than the front signal lines disposed at the inner side.

9. The display device of claim 1, wherein the rear signal lines disposed at the outer side have greater thickness than the rear signal lines disposed at the inner side.

10. The display device of claim 1, wherein connection lines disposed at an outer side among the connection lines have a larger width than connection lines disposed at an inner side among the connection lines.

11. The display device of claim 10, wherein the connection lines disposed at the outer side have a greater thickness than the connection lines disposed at the inner side.

12. The display device of claim 1, further comprising:
transistors disposed on the first portion of the base layer and electrically connected to the light emitting elements; and
a power line providing an initialization voltage to the transistors, wherein the power line and the third front signal line are disposed on a same layer.

13. A display device comprising:
a display area in which pixels are disposed and a non-display area in which the pixels are not disposed,
wherein the display device comprises:
  a base layer including a first portion overlapping the display area, a second portion extending from the first portion, being bent, and overlapping the non-display area, and a third portion extending from the second portion; and
  wherein the pixels comprise a first pixel, a second pixel, and a third pixel,
wherein the first pixel, the second pixel, and the third pixel include a first light emitting element, a second light emitting element, and a third light emitting element, respectively, and
  a first front signal line disposed on the first portion and electrically connected to the first pixel;
  a second front signal line disposed on the first portion and electrically connected to the second pixel, wherein the first front signal line and the second front signal line are disposed on different layers;
  a third front signal line electrically connected to the third pixel, wherein the first front signal line, the second front signal line, and the third front signal line are disposed on different layers, wherein the second front signal line is disposed between the first front signal line and the third front signal line in a plan view, and the second front signal line is spaced apart from the first front signal line and the third front signal line;
  a first rear signal line disposed on the third portion, wherein the first rear signal line and the first front signal line are disposed on a same layer;
  a second rear signal line disposed on the third portion, wherein the second rear signal line and the second front signal line are disposed on a same layer;
  a third rear signal line disposed on the third portion, wherein the third rear signal line and the third front signal line are disposed on a same layer; and
  connection lines that overlap the second portion, wherein at least one of the connection lines electrically connects the first front signal line and the third rear signal line,
a first insulating layer covering the first front signal line and the first rear signal line, the first insulating layer disposed under the second front signal line and the second rear signal line;
a second insulating layer covering the second front signal line and the second rear signal line, the second insulating layer disposed under the third front signal line and the third rear signal line;
a third insulating layer covering the third front signal line and the third rear signal line, the third insulating layer disposed under the connection lines; and
contact holes defined through the first insulating layer, the second insulating layer, and the third insulating layer,
wherein the first front signal line, the second front signal line, the third front signal line, the first rear signal line, the second rear signal line, and the third rear signal line are electrically connected to the connection lines through the contact holes.

14. A display device comprising:
a display area in which pixels are disposed and a non-display area in which the pixels are not disposed,
wherein the display device comprises:
  a base layer including a first portion overlapping the display area, a second portion extending from the first portion, being bent, and overlapping the non-display area, and a third portion extending from the second portion; and
  wherein the pixels comprise light emitting elements disposed on the first portion, and
    first front signal lines electrically connected to at least one of the pixels and disposed on the first portion;
    second front signal lines electrically connected to at least one of the pixels and disposed on the first portion, wherein the first front signal lines are disposed on a layer different from a layer on which the second front signal lines are disposed;
    third front signal lines electrically connected to at least one of the pixels and disposed on a layer different from a layer on which the first front signal lines and the second front signal lines are disposed, wherein each of the second front signal lines is disposed between a corresponding first front signal line of the first front signal lines and a corresponding third front signal line of the third front signal lines in a plan view, and each of the second front signal lines is spaced apart from the corresponding first front signal line of the first front signal lines and the corresponding third front signal line of the third front signal lines;
    second rear signal lines disposed on the third portion and disposed on a same layer as the second front signal lines are disposed on;
    third rear signal lines disposed on the third portion and disposed on a same layer as the third front signal lines are disposed on; and
    connection lines electrically connecting the first front signal lines to the second rear signal lines and electrically connecting the second front signal lines and the third front signal lines to the third rear signal lines.

15. The display device of claim 14, further comprising a data driving circuit disposed on the third portion of the base layer, wherein the data driving circuit is electrically connected to the second rear signal lines and the third rear signal lines.

16. The display device of claim 14, wherein
each of the first front signal lines, the second front signal lines, the third front signal lines, the second rear signal lines, and the third rear signal lines comprise a first metal material, and
each of the connection lines comprises a second metal material different from the first metal material.

17. The display device of claim 14, wherein front signal lines disposed at an outer side among the first front signal lines, the second front signal lines, and the third front signal lines have a larger width or a greater thickness than front signal lines disposed at an inner side among the first front signal lines, the second front signal lines, and the third front signal lines.

18. The display device of claim 14, further comprising:
transistors disposed on the first portion of the base layer and electrically connected to the light emitting elements; and
a power line providing an initialization voltage to the transistors, wherein the power line and the third front signal lines are disposed on a same layer.

19. The display device of claim 14, further comprising:
a first insulating layer covering the first front signal lines, the first insulating layer disposed under the second front signal lines and the second rear signal lines;
a second insulating layer covering the second front signal lines and the second rear signal lines, the second insulating layer disposed under the third front signal lines and the third rear signal lines;
a third insulating layer covering the third front signal lines and the third rear signal lines, the third insulating layer disposed under the connection lines; and
contact holes defined through the first insulating layer, the second insulating layer, and the third insulating layer,
wherein the first front signal lines, the second front signal lines, the third front signal lines, the second rear signal lines, and the third rear signal lines are electrically connected to the connection lines through the contact holes.

* * * * *